(12) United States Patent
Waidhas et al.

(10) Patent No.: US 12,431,424 B2
(45) Date of Patent: Sep. 30, 2025

(54) BURIED POWER RAILS INTEGRATED WITH DECOUPLING CAPACITANCE

(71) Applicant: Intel Corporation, Santa Clara, CA (US)

(72) Inventors: Bernd Waidhas, Pettendorf (DE);
Harald Gossner, Riemerling (DE);
Wolfgang Molzer, Ottobrunn (DE);
Georg Seidemann, Landshut (DE);
Michael Langenbuch, Munich (DE);
Martin Ostermayr, Woerth (DE);
Joachim Singer, Munich (DE);
Thomas Wagner, Regelsbach (DE);
Klaus Herold, Munich (DE)

(73) Assignee: Intel Corporation, Santa Clara, CA (US)

(*) Notice: Subject to any disclaimer, the term of this patent is extended or adjusted under 35 U.S.C. 154(b) by 774 days.

(21) Appl. No.: 17/554,112

(22) Filed: Dec. 17, 2021

(65) Prior Publication Data

US 2023/0197599 A1    Jun. 22, 2023

(51) Int. Cl.
*H01L 23/522*    (2006.01)
*H01L 23/528*    (2006.01)
(Continued)

(52) U.S. Cl.
CPC ...... *H01L 23/5226* (2013.01); *H01L 23/5286* (2013.01); *H01L 23/535* (2013.01);
(Continued)

(58) Field of Classification Search
CPC ............ H01L 23/5226; H01L 23/5286; H01L 23/535; H01L 23/5223; H10D 84/0186;
(Continued)

(56) References Cited

U.S. PATENT DOCUMENTS

2016/0155751 A1* 6/2016 Shin et al. ........... H10D 30/689
257/326
2020/0411436 A1* 12/2020 Xie et al. ........... H10D 84/0158
(Continued)

OTHER PUBLICATIONS

Gupta, Anshul et al "Buried Power Rail Integration with FinFETs for Ultimate CMOS Scaling", IEEE Transactions on Electron Devices, vol. 67, No. 12, Dec. 2020, pp. 54349-5354.
(Continued)

*Primary Examiner* — Christine S. Kim
*Assistant Examiner* — Nathalie R Fayette
(74) *Attorney, Agent, or Firm* — Akona IP PC

(57) ABSTRACT

IC devices including BPRs with integrated decoupling capacitance are disclosed. An example IC device includes a first layer comprising a transistor and a support structure adjoining the first layer. The support structure includes BPRs, which are power rails buried in the support structure, and a decoupling capacitor based on the BPRs. The conductive cores of the BPRs are the electrodes of the decoupling capacitor. The dielectric barriers of the BPRs can be the dielectric of the decupling capacitor. The dielectric of the decupling capacitor may also include a dielectric element between the BPRs. Additionally or alternatively, the IC device includes another decoupling capacitor at the backside of the support structure. The other decoupling capacitor is coupled to the BPRs and can provide additional decoupling capacitance for stabilizing power supply facilitated by the BPRs.

18 Claims, 15 Drawing Sheets

(51) Int. Cl.
  *H01L 23/535* (2006.01)
  *H10D 84/01* (2025.01)
  *H10D 84/03* (2025.01)
  *H10D 84/85* (2025.01)

(52) U.S. Cl.
  CPC ..... *H10D 84/0186* (2025.01); *H10D 84/0193* (2025.01); *H10D 84/038* (2025.01); *H10D 84/853* (2025.01)

(58) Field of Classification Search
  CPC ............. H10D 84/0193; H10D 84/038; H10D 84/853; H10D 84/834; H10D 84/811; H10D 84/0158
  See application file for complete search history.

(56) References Cited

U.S. PATENT DOCUMENTS

2021/0083129 A1* 3/2021 Liu et al. ............... H10D 1/047
2021/0272904 A1* 9/2021 Komuro et al. ....... H10D 88/01
2021/0375762 A1* 12/2021 Chen et al. ......... G06F 30/3953

OTHER PUBLICATIONS

Lambert, William J. et al, "Package Inductors for Intel Fully Integrated Voltage Regulators", IEEE Transactions on Components, Packaging and Manufacturing Technology, vol. 6, No. 1, Jan. 2016, pp. 3-11.

Prasad, Divya et al, "Buried Power Rails and Back-side Power Grids: Arm® CPU Power Delivery Network Design Beyond 5nm", 2019 IEEE International Electron Devices Meeting (IEDM), Dec. 7-11, 2019, pp. 19.1.1-19.1.4.

Ryckaert, J. et al, "Extending the roadmap beyond 3nm through system scaling boosters: A case study on Buried Power Rail and Backside Power Delivery", 2019 Electron Devices Technology and Manufacturing Conference (EDTM) (2019), pp. 50-52.

* cited by examiner

BURIED POWER RAILS INTEGRATED WITH DECOUPLING CAPACITANCE

TECHNICAL FIELD

This disclosure relates generally to the field of semiconductor devices, and more specifically, to integrated circuit (IC) structures.

BACKGROUND

For the past several decades, the scaling of features in ICs has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. Buried power rails (BPRs) can be a key scaling booster for complementary metal-oxide-semiconductor (CMOS) extension, e.g., beyond the 5-nm node.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figure 1:
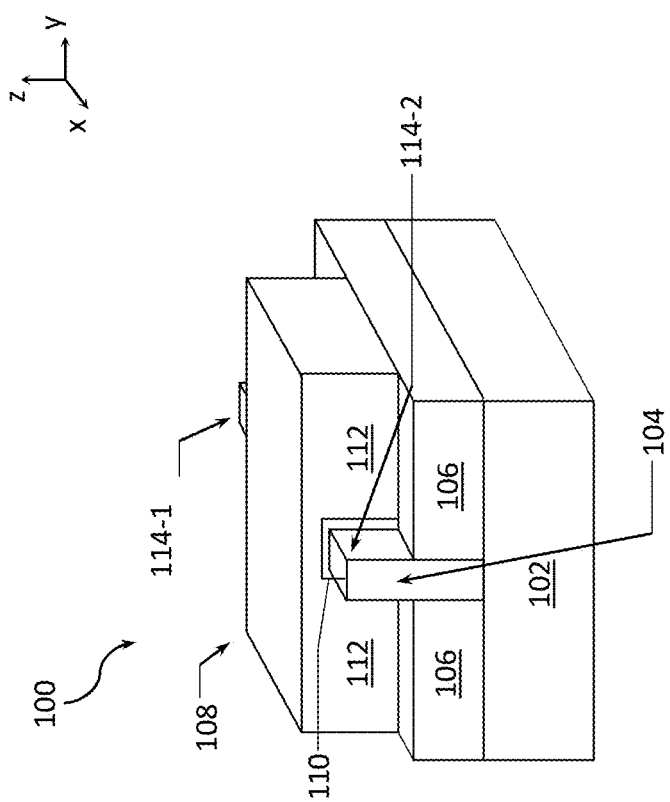
FIG. 1 is a perspective view of an example fin-based field-effect transistor (FET), or FinFET, according to some embodiments of the disclosure.

The systems, methods, and devices of this disclosure each have several innovative aspects, no single one of which is solely responsible for all of the desirable attributes disclosed herein. Details of one or more implementations of the subject matter described in this specification are set forth in the description below and the accompanying drawings.

For purposes of illustrating IC devices with BPRs with integrated decoupling capacitance, proposed herein, it might be useful to first understand phenomena that may come into play in such structures. The following foundational information may be viewed as a basis from which the present disclosure may be properly explained. Such information is offered for purposes of explanation only and, accordingly, should not be construed in any way to limit the broad scope of the present disclosure and its potential applications. While some of the following descriptions may be provided for the example of transistors being implemented as FinFETs, nanoribbon FETs, or nanowire FETs, embodiments of the present disclosure are equally applicable to IC devices employing transistors of other architectures such as to planar transistors.

Relentless scaling of transistors and wires in advanced semiconductor technologies has not only resulted in major process-related challenges but has also imposed severe design challenges in the sub-5 nm technology regime. Dimensional scaling of designs has been made possible by (i) Front-End-of-Line (FEOL) and Back-End-of-Line (BEOL) pitch scaling, which worsens short-channel effects in transistors and increases wire/contact resistances; and, (ii) fin depopulation in logic cells, which causes degradation of transistor drive. To enable further area scaling in sub-5 nm nodes, an approach of burying the power rails into the substrate has been proposed, which no longer requires reserving two routing tracks for power nets (e.g., VDD or VSS) in the logic cell area. Additionally, these BPRs can achieve a higher aspect ratio, thus, exhibiting lower resistance than local level BEOL power rails. BPRs can be a key scaling booster for complementary metal-oxide-semiconductor (CMOS) extension beyond the 5-nm node. Power lines which conventionally run outside substrates can be replaced with power lines "buried" within substrates, such as shallow trench isolation (STI) and Si substrate. Such power lines are called BPRs. A BPR is a power rail that is at least partially buried in a support structure, e.g., a substrate, die, etc. A BPR includes an electrically conductive material, such as metal. A rail can have an elongated structure having a longitudinal axis, which may be parallel to the frontside surface or the backside surface of the support structure. BPR frees up routing resources, which results in logic cell height reduction and overall area scaling.

With the advent of BPRs in IC process technologies, the stabilization of the power supply on chip needs to be revisited. To stabilize the power supply for active circuitry, usually buffer capacitances are connected to the power rails. The capacitances are realized with big transistor arrays, metal finger capacitors and/or metal-insulator-metal (MIM) capacitances placed beneath the active circuitry. The realization of buffer capacitances within the IC can use a big portion of the precious chip area, which is so lost for active circuitry. Further in the presence of BPR, the connection to capacitances to the power rails gets high resistance and the buffer capacitances become less effective.

Embodiments of the present invention relate to IC devices including BPRs integrated with decoupling capacitors. An example IC device includes a decoupling capacitor based on BPRs. The IC device includes a first layer comprising transistors and a support structure adjoining the first layer. The decoupling capacitor is in the support structure. The decoupling capacitor includes a first and a second BPRs and a dielectric element, where the BPRs function as electrodes of the decoupling capacitor. The capacitance of the decoupling capacitor per unit length of the first or second power rail is no less than 1 femto farad per micrometer (fF/µm). The capacitance can stabilize the power supply of the IC device. The first and second BPRs may be in parallel and the dielectric element is between the first and second BPRs. Alternatively, the first BPR encloses at least part of the dielectric element and the dielectric element encloses at least part of the second power rail. The BPRs can be coupled to a separate capacitor that provides additional decoupling capacitance. The separate capacitor can be placed at the backside of the support structure. The separate capacitor includes conductive elements and a dielectric element. The separate capacitor may be a planar capacitor, where the conductive elements are in parallel and the dielectric element is between the conductive elements, or an interdigital capacitor. The BPRs can be coupled to the conductive elements of the separate capacitor by through-substrate vias (TSVs). A TSV is a via at least partially buried in the support structure.

The integration of the buffer capacitance into the BPRs can reduce the connection resistance. Also, by elimination the need of placing buffer capacitances on chip, chip area can be saved for more active circuitry. The integrated decoupling capacitance has a low ohmic connection to BPRs, which can better stabilize the power supply.

Elongated structures are mentioned throughout the present description. As used herein, a structure is referred to as an elongated if a length of the structure (measured alone one axis of an example coordinate system) is greater than both a width of the structure (measured along another axis of the example coordinate system) and a height of the structure (measured along a third axis of the example coordinate system). For example, elongated semiconductor structures as described herein may be fins or nanoribbons, having a length measured along an x-axis of the coordinate system shown in the present drawings, a width measured along a y-axis of the coordinate system shown in the present drawings, and a height measured along a z-axis of the coordinate system shown in the present drawings. Because BPRs described herein, as well as openings above them, are substantially parallel to the semiconductor structures, their lengths, widths, and heights are also measured along, respectively, an x-axis, a y-axis, and a z-axis of the x-y-z coordinate system shown in the present drawings. On the other hand, when the metal gate lines are substantially perpendicular to the semiconductor structures, as shown in the embodiments of the present drawings, their lengths, widths, and heights are measured along, respectively, a y-axis, an x-axis, and a z-axis of the x-y-z coordinate system shown.

While some of the descriptions provided herein refer to FinFETs, these descriptions are equally applicable to embodiments any other non-planar FETs besides FinFETs, e.g., to nanoribbon transistors, nanowire transistors, or transistors such as nanoribbon/nanowire transistors but having transverse cross-sections of any geometry (e.g., oval, or a polygon with rounded corners).

IC devices as described herein, in particular IC devices with including a BPRs integrated with decoupling capacitance as described herein, may be used for providing electrical connectivity to one or more components associated with an IC or/and between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

For purposes of explanation, specific numbers, materials, and configurations are set forth in order to provide a thorough understanding of the illustrative implementations. However, it will be apparent to one skilled in the art that the present disclosure may be practiced without the specific details or/and that the present disclosure may be practiced with only some of the described aspects. In other instances, well-known features are omitted or simplified in order not to obscure the illustrative implementations.

Further, references are made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, if a collection of drawings designated with different letters are present, such a collection may be referred to herein without the letters.

In the drawings, some schematic illustrations of example structures of various devices and assemblies described herein may be shown with precise right angles and straight lines, this is simply for ease of illustration, and embodiments of these assemblies may be curved, rounded, or otherwise irregularly shaped as dictated by, and sometimes inevitable due to, the manufacturing processes used to fabricate semiconductor device assemblies. Therefore, it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication. Furthermore, although a certain number of a given element may be illustrated in some of the drawings (e.g., a certain number of semiconductor structures, a certain number of electrically conductive layers, a certain number of BPRs, a certain number of vias, a certain number of through-substrate vias (TSVs), a certain number of capacitors, etc.), this is simply for ease of illustration, and more, or less, than that number may be included in an IC device with at least one BPR as described herein. Still further, various views shown in some of the drawings are intended to show relative arrangements of various elements therein. In other embodiments, various IC devices with BPRs as described herein, or portions thereof, may include other elements or components that are not illustrated (e.g., transistor portions, various components that may be in electrical contact with any of the transistors, etc.). Inspection of layout and mask data and reverse engineering of parts of a device to reconstruct the circuit using e.g., optical microscopy, TEM, or SEM, and/or inspection of a cross-section of a device to detect the shape and the location of various device elements described herein using e.g., Physical Failure Analysis (PFA) would allow determination of presence of IC devices with BPRs as described herein.

Various operations may be described as multiple discrete actions or operations in turn, in a manner that is most helpful in understanding the claimed subject matter. However, the order of description should not be construed as to imply that these operations are necessarily order dependent. These operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges.

The description uses the phrases "in an embodiment" or "in embodiments," which may each refer to one or more of the same or different embodiments. The terms "comprising," "including," "having," and the like, as used with respect to embodiments of the present disclosure, are synonymous. The disclosure may use perspective-based descriptions such as "above," "below," "top," "bottom," and "side" to explain various features of the drawings, but these terms are simply for ease of discussion, and do not imply a desired or required orientation. The accompanying drawings are not necessarily drawn to scale. Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

In the following detailed description, various aspects of the illustrative implementations will be described using terms commonly employed by those skilled in the art to convey the substance of their work to others skilled in the art.

For example, some descriptions may refer to a particular source or drain region or contact being either a source region/contact or a drain region/contact. However, unless specified otherwise, which region/contact of a transistor is considered to be a source region/contact and which region/contact is considered to be a drain region/contact is not important because under certain operating conditions, designations of source and drain are often interchangeable. Therefore, descriptions provided herein may use the term of a "S/D" region/contact to indicate that the region/contact can be either a source region/contact, or a drain region/contact.

In another example, if used, the terms "package" and "IC package" are synonymous, as are the terms "die" and "IC die," the term "insulating" means "electrically insulating," the term "conducting" means "electrically conducting," unless otherwise specified. Although certain elements may be referred to in the singular herein, such elements may include multiple sub-elements. For example, "an electrically conductive material" may include one or more electrically conductive materials.

In another example, if used, the terms "oxide," "carbide," "nitride," etc. refer to compounds containing, respectively, oxygen, carbon, nitrogen, etc., the term "high-k dielectric" refers to a material having a higher dielectric constant than silicon oxide, while the term "low-k dielectric" refers to a material having a lower dielectric constant than silicon oxide.

In yet another example, a term "interconnect" may be used to describe any element formed of an electrically conductive material for providing electrical connectivity to one or more components associated with an IC or/and between various such components. In general, the "interconnect" may refer to both conductive lines/wires (also sometimes referred to as "lines" or "metal lines" or "trenches") and conductive vias (also sometimes referred to as "vias" or "metal vias"). In general, a term "conductive line" may be used to describe an electrically conductive element isolated by a dielectric material typically comprising an interlayer low-k dielectric that is provided within the plane of an IC chip. Such conductive lines are typically arranged in several levels, or several layers, of metallization stacks. On the other hand, the term "conductive via" may be used to describe an electrically conductive element that interconnects two or more conductive lines of different levels of a metallization stack. To that end, a via may be provided substantially perpendicularly to the plane of an IC chip or a support structure over which an IC device is provided and may interconnect two conductive lines in adjacent levels or two conductive lines in not adjacent levels. A term "metallization stack" may be used to refer to a stack of one or more interconnects for providing connectivity to different circuit components of an IC chip.

Furthermore, the term "connected" may be used to describe a direct electrical or magnetic connection between the things that are connected, without any intermediary devices, while the term "coupled" may be used to describe either a direct electrical or magnetic connection between the things that are connected, or an indirect connection through one or more passive or active intermediary devices. The term "circuit" may be used to describe one or more passive and/or active components that are arranged to cooperate with one another to provide a desired function.

The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

Example FinFET

FIG. 1 is a perspective view of an example FinFET 100, according to some embodiments of the disclosure. The FinFET 100 illustrates one example of a transistor that can be coupled to BPRs. For example, the FinFET 100 may be a transistor illustrated in the IC devices shown in FIGS. 2-11. The FinFET 100 shown in FIG. 1 is intended to show relative arrangement(s) of some of the components therein. In various embodiments, the FinFET 100, or portions thereof, may include other components that are not illustrated (e.g., any further materials, such as spacer materials, surrounding the gate stack of the FinFET 100, electrical contacts to the S/D regions of the FinFET 100, etc.).

As shown in FIG. 1, the FinFET 100 may be provided over a support structure 102, where the support structure 102 may be any suitable support structure on which a transistor may be built, e.g., a substrate, a die, a wafer, or a chip. As also shown in FIG. 1, the FinFET 100 may include a fin 104, extending away from the support structure 102. A portion of the fin 104 that is closest to the support structure 102 may be enclosed by an insulator material 106, commonly referred to as an "STI material" or, simply, "STI." The portion of the fin 104 enclosed on its' sides by the STI 106 is typically referred to as a "subfin portion" or simply a "subfin." As further shown in FIG. 1, a gate stack 108 that includes at least a layer of a gate electrode material 112 and, optionally, a layer of a gate dielectric 110, may be provided over the top and sides of the remaining upper portion of the fin 104 (e.g., the portion above and not enclosed by the STI 106), thus wrapping around the upper-most portion of the fin 104. The portion of the fin 104 over which the gate stack 108 wraps around may be referred to as a "channel portion" of the fin 104 because this is where, during operation of the FinFET 100, a conductive channel may form. The channel portion of the fin 104 is a part of an active region of the fin 104. A first S/D region 114-1 and a second S/D region 114-2 (also commonly referred to as "diffusion regions") are provided on the opposite sides of the gate stack 108, forming source and drain terminals of the FinFET 100.

In general, implementations of the present disclosure may be formed or carried out on a support structure such as a semiconductor substrate, composed of semiconductor material systems including, for example, n-type or p-type materials systems. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V, group II-VI, or group IV materials. In some embodiments, the substrate may be non-crystalline. In some embodiments, the support structure 102 may be a printed circuit board (PCB) substrate. Although a few examples of materials from which the substrate may be formed are described here, any material that may serve as a foundation upon which IC devices implementing BPRs integrated with decoupling capacitance as described herein may be built falls within the spirit and scope of the present disclosure. In various embodiments, the support structure 102 may include any such substrate material that provides a suitable surface for forming the FinFET 100. The support structure 102 may, e.g., be the wafer 2000 of FIG. 12A, discussed below, and may be, or be included in, a die, e.g., the singulated die 2002 of FIG. 12B, discussed below.

As shown in FIG. 1, the fin 104 may extend away from the support structure 102 and may be substantially perpendicular to the support structure 102. The fin 104 may include one or more semiconductor materials, e.g., a stack of semiconductor materials, so that the upper-most portion of the fin (namely, the portion of the fin 104 enclosed by the gate stack 108) may serve as the channel region of the FinFET 100. Therefore, as used herein, the term "channel material" of a transistor may refer to such upper-most portion of the fin 104, or, more generally, to any portion of one or more semiconductor materials in which a conductive channel between source and drain regions may be formed during operation of a transistor.

As shown in FIG. 1, the STI material 106 may enclose the sides of the fin 104. A portion of the fin 104 enclosed by the STI 106 forms a subfin. In various embodiments, the STI material 106 may be a low-k or high-k dielectric including, but not limited to, elements such as hafnium, silicon, oxygen, nitrogen, titanium, tantalum, lanthanum, aluminum, zirconium, barium, strontium, yttrium, lead, scandium, niobium, and zinc. Further examples of dielectric materials that may be used in the STI material 106 may include, but are not limited to silicon nitride, silicon oxide, silicon dioxide, silicon carbide, silicon nitride doped with carbon, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate.

Above the subfin portion of the fin 104, the gate stack 108 may wrap around the fin 104 as shown in FIG. 1. In particular, the gate dielectric 110 may wrap around the upper-most portion of the fin 104, and the gate electrode 112 may wrap around the gate dielectric 110. The interface between the channel portion of the fin 104 and the subfin portion of the fin 104 is located proximate to where the gate electrode 112 ends.

The gate electrode 112 may include one or more gate electrode materials, where the choice of the gate electrode materials may depend on whether the FinFET 100 is a p-type metal-oxide-semiconductor (PMOS) transistor or an n-type metal-oxide-semiconductor (NMOS) transistor. For a PMOS transistor, gate electrode materials that may be used in different portions of the gate electrode 112 may include, but are not limited to, ruthenium, palladium, platinum, cobalt, nickel, and conductive metal oxides (e.g., ruthenium oxide). For an NMOS transistor, gate electrode materials that may be used in different portions of the gate electrode 112 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode 112 may include a stack of a plurality of gate electrode materials, where zero or more materials of the stack are workfunction (WF) materials and at least one material of the stack is a fill metal layer. Further materials/layers may be included next to the gate electrode 112 for other purposes, such as to act as a diffusion barrier layer or/and an adhesion layer.

If used, the gate dielectric 110 may include a stack of one or more gate dielectric materials. In some embodiments, the gate dielectric 110 may include one or more high-k dielectric materials. In various embodiments, the high-k dielectric materials of the gate dielectric 110 may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric 110 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 110 during manufacture of the FinFET 100 to improve the quality of the gate dielectric 110.

In some embodiments, the gate stack 108 may be surrounded by a dielectric spacer, not specifically shown in FIG. 1. The dielectric spacer may be configured to provide separation between the gate stacks 108 of different FinFETs 100 which may be provided along a single fin (e.g., different FinFETs provided along the fin 104, although FIG. 1 only illustrates one of such FinFETs), as well as between the gate stack 108 and the source/drain contacts disposed on each side of the gate stack 108. Such a dielectric spacer may include one or more low-k dielectric materials. Examples of the low-k dielectric materials that may be used as the dielectric spacer include, but are not limited to, silicon dioxide, carbon-doped oxide, silicon nitride, fused silica glass (FSG), and organosilicates such as silsesquioxane, siloxane, and organosilicate glass. Other examples of low-k dielectric materials that may be used as the dielectric spacer include organic polymers such as polyimide, polynorbornenes, benzocyclobutene, perfluorocyclobutane, or polytetrafluoroethylene (PTFE). Still other examples of low-k dielectric materials that may be used as the dielectric spacer include silicon-based polymeric dielectrics such as hydrogen silsesquioxane (HSQ) and methylsilsesquioxane (MSQ). Other examples of low-k materials that may be used in a dielectric spacer include various porous dielectric materials, such as for example porous silicon dioxide or porous carbon-doped silicon dioxide, where large voids or pores are created in a dielectric in order to reduce the overall dielectric constant of the layer, since voids can have a dielectric constant of nearly 1. When such a dielectric spacer is used, then the lower portions of the fin 104, e.g., the subfin portion of the fin 104, may be surrounded by the STI material 106 which may, e.g., include any of the high-k dielectric materials described herein.

In some embodiments, the fin 104 may be composed of semiconductor material systems including, for example, n-type or p-type materials systems. In some embodiments, the fin 104 may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In some embodiments, the fin 104 may include a combination of semiconductor materials where one semiconductor material is used for the channel portion and another material, sometimes referred to as a "blocking material," is used for at least a portion of the subfin portion of the fin 104. In some embodiments, the subfin and the channel portions of the fin 104 are each formed of monocrystalline semiconductors, such as silicon or germanium. In a first embodiment, the subfin and the channel portion of the fin 104 are each formed of compound semiconductors with a first sub-lattice of at least one element from group III of the periodic table (e.g., Al, Ga, In), and a second sub-lattice of at least one element of group V of the periodic table (e.g., P, As, Sb). The subfin may be a binary, ternary, or quaternary III-V compound semiconductor that is an alloy of two, three, or even four elements from groups III and V of the periodic table, including boron, aluminum, indium, gallium, nitrogen, arsenic, phosphorus, antimony, and bismuth.

For some example n-type transistor embodiments (i.e., for the embodiments where the FinFET 100 is an NMOS), the channel portion of the fin 104 may advantageously include a III-V material having a high electron mobility, such as, but not limited to InGaAs, InP, InSb, and InAs. For some such embodiments, the channel portion of the fin 104 may be a ternary III-V alloy, such as InGaAs, GaAsSb, InAsP, or InPSb. For some $In_xGa_{1-x}As$ fin embodiments, In content (x) may be between 0.6 and 0.9, and may advantageously be at least 0.7 (e.g., $In_{0.7}Ga_{0.3}As$). In some embodiments with highest mobility, the channel portion of the fin 104 may be an intrinsic III-V material, i.e., a III-V semiconductor material not intentionally doped with any electrically active impurity. In alternate embodiments, a nominal impurity dopant level may be present within the channel portion of the fin 104, for example to further fine-tune a threshold voltage Vt, or to provide HALO pocket implants, etc. Even for impurity-doped embodiments however, impurity dopant level within the channel portion of the fin 104 may be relatively low, for example below $10^{15}$ dopant atoms per cubic centimeter ($cm^{-3}$), and advantageously below $10^{13}$ $cm^{-3}$. The subfin portion of the fin 104 may be a III-V material having a band offset (e.g., conduction band offset for n-type devices) from the channel portion. Example materials include, but are not limited to, GaAs, GaSb, GaAsSb, GaP, InAlAs, GaAsSb, AlAs, AlP, AlSb, and AlGaAs. In some n-type transistor embodiments of the FinFET 100 where the channel portion of the fin 104 is InGaAs, the subfin may be GaAs, and at least a portion of the subfin may also be doped with impurities (e.g., p-type) to a greater impurity level than the channel portion. In an alternate heterojunction embodiment, the subfin and the channel portion of the fin 104 are each, or include, group IV semiconductors (e.g., Si, Ge, SiGe). The subfin of the fin 104 may be a first elemental semiconductor (e.g., Si or Ge) or a first SiGe alloy (e.g., having a wide bandgap).

For some example p-type transistor embodiments (i.e., for the embodiments where the FinFET 100 is a PMOS), the channel portion of the fin 104 may advantageously be a group IV material having a high hole mobility, such as, but not limited to Ge or a Ge-rich SiGe alloy. For some example embodiments, the channel portion of the fin 104 may have a Ge content between 0.6 and 0.9, and advantageously may be at least 0.7. In some embodiments with highest mobility, the channel portion may be intrinsic III-V (or IV for p-type devices) material and not intentionally doped with any electrically active impurity. In alternate embodiments, one or more a nominal impurity dopant level may be present within the channel portion of the fin 104, for example to further set a threshold voltage Vt, or to provide HALO pocket implants, etc. Even for impurity-doped embodiments however, impurity dopant level within the channel portion is relatively low, for example below $10^{15}$ $cm^{-3}$, and advantageously below $10^{13}$ $cm^{-3}$. The subfin of the fin 104 may be a group IV material having a band offset (e.g., valance band offset for p-type devices) from the channel portion. Example materials include, but are not limited to, Si or Si-rich SiGe. In some p-type transistor embodiments, the subfin of the fin 104 is Si and at least a portion of the subfin may also be doped with impurities (e.g., n-type) to a higher impurity level than the channel portion.

Turning to the first S/D region 114-1 and the second S/D region 114-2 on respective different sides of the gate stack 108, in some embodiments, the first S/D region 114-1 may be a source region and the second S/D region 114-2 may be a drain region. In other embodiments this designation of source and drain may be interchanged, i.e., the first S/D region 114-1 may be a drain region and the second S/D region 114-2 may be a source region. Although not specifically shown in FIG. 1, the FinFET 100 may further include S/D electrodes (also commonly referred to as "S/D contacts"), formed of one or more electrically conductive materials, for providing electrical connectivity to the S/D regions 114, respectively. In some embodiments, the S/D regions 114 of the FinFET 100 may be regions of doped semiconductors, e.g., regions of doped channel material of the fin 104, so as to supply charge carriers for the transistor channel. In some embodiments, the S/D regions 114 may be highly doped, e.g., with dopant concentrations of about $1 \cdot 10^{21}$ cm$^{-3}$, in order to advantageously form Ohmic contacts with the respective S/D electrodes, although these regions may also have lower dopant concentrations and may form Schottky contacts in some implementations. Irrespective of the exact doping levels, the S/D regions 114 of the FinFET 100 are the regions having dopant concentration higher than in other regions, e.g., higher than a dopant concentration in a region of the semiconductor channel material between the first S/D region 114-1 and the second S/D region 114-2, and, therefore, may be referred to as "highly doped" (HD) regions.

In some embodiments, the S/D regions 114 may generally be formed using either an implantation/diffusion process or an etching/deposition process. In the former process, dopants such as boron, aluminum, antimony, phosphorous, or arsenic may be ion-implanted into the one or more semiconductor materials of the upper portion of the fin 104 to form the S/D regions 114. An annealing process that activates the dopants and causes them to diffuse further into the fin 104 may follow the ion implantation process. In the latter process, the one or more semiconductor materials of the fin 104 may first be etched to form recesses at the locations for the future source and drain regions. An epitaxial deposition process may then be carried out to fill the recesses with material (which may include a combination of different materials) that is used to fabricate the S/D regions 114. In some implementations, the S/D regions 114 may be fabricated using a silicon alloy such as silicon germanium or silicon carbide. In some implementations, the epitaxially deposited silicon alloy may be doped in situ with dopants such as boron, arsenic, or phosphorous. In further embodiments, the S/D regions 114 may be formed using one or more alternate semiconductor materials such as germanium or a group III-V material or alloy. Although not specifically shown in the perspective illustration of FIG. 1, in further embodiments, one or more layers of metal and/or metal alloys may be used to form the source and drain contacts (i.e., electrical contacts to each of the S/D regions 114).

The FinFET 100 may have a gate length, GL, (i.e., a distance between the first S/D region 114-1 and the second S/D region 114-2), a dimension measured along the longitudinal axis of the fin 104, which extends in the direction of the x-axis of the example reference coordinate system x-y-z shown in the present drawings, where the gate length may, in some embodiments, be between about 5 and 40 nanometers, including all values and ranges therein (e.g. between about 22 and 35 nanometers, or between about 15 and 25 nanometers). The fin 104 may have a thickness, a dimension measured in the direction of the y-axis of the reference coordinate system x-y-z shown in FIG. 1, that may, in some embodiments, be between about 4 and 15 nanometers, including all values and ranges therein (e.g., between about 5 and 10 nanometers, or between about 7 and 12 nanometers). The fin 104 may have a height, a dimension measured in the direction of the z-axis of the reference coordinate system x-y-z shown in FIG. 1, which may, in some embodiments, be between about 30 and 350 nanometers, including all values and ranges therein (e.g., between about 30 and 200 nanometers, between about 75 and 250 nanometers, or between about 150 and 300 nanometers).

Although the fin 104 is illustrated in FIG. 1 as having a rectangular cross-section in a z-y plane of the reference coordinate system shown in FIG. 1, the fin 104 may instead have a cross-section that is rounded or sloped at the "top" of the fin 104, and the gate stack 108 (including the different portions of the gate dielectric 110) may conform to this rounded or sloped fin 104. In use, the FinFET 100 may form conducting channels on three "sides" of the channel portion of the fin 104, potentially improving performance relative to single-gate transistors (which may form conducting channels on one "side" of a channel material or substrate) and double-gate transistors (which may form conducting channels on two "sides" of a channel material or substrate). While FIG. 1 illustrates a single FinFET 100, in some embodiments, a plurality of FinFETs may be arranged next to one another (with some spacing in between) along the fin 104.

Other types of semiconductor structures can be used in a FET. For example, nanoribbon-based FETs include elongated semiconductor structures called nanoribbons as semiconductor structures. As another example, nanowire-based FETs include nanowires as semiconductor structures. As used herein, the term "nanoribbon" refers to an elongated semiconductor structure having a longitudinal axis parallel to the support structure over which a memory device is provided. Typically, a length of a such a structure (i.e., a dimension measured along the longitudinal axis, shown in the present drawings to be along the y-axis of an example x-y-z coordinate system) is greater than each of a width (i.e., a dimension measured along the x-axis of the example coordinate system shown in the present drawings) and a thickness/height (i.e., a dimension measured along the z-axis of the example coordinate system shown in the present drawings). In some settings, the terms "nanoribbon" or "nanosheet" have been used to describe elongated semiconductor structures that have a rectangular transverse cross-section (i.e., a cross-section in a plane perpendicular to the longitudinal axis of the structure), while the term "nanowire" has been used to describe similar elongated structures but with circular transverse cross-sections.

Figure 2:
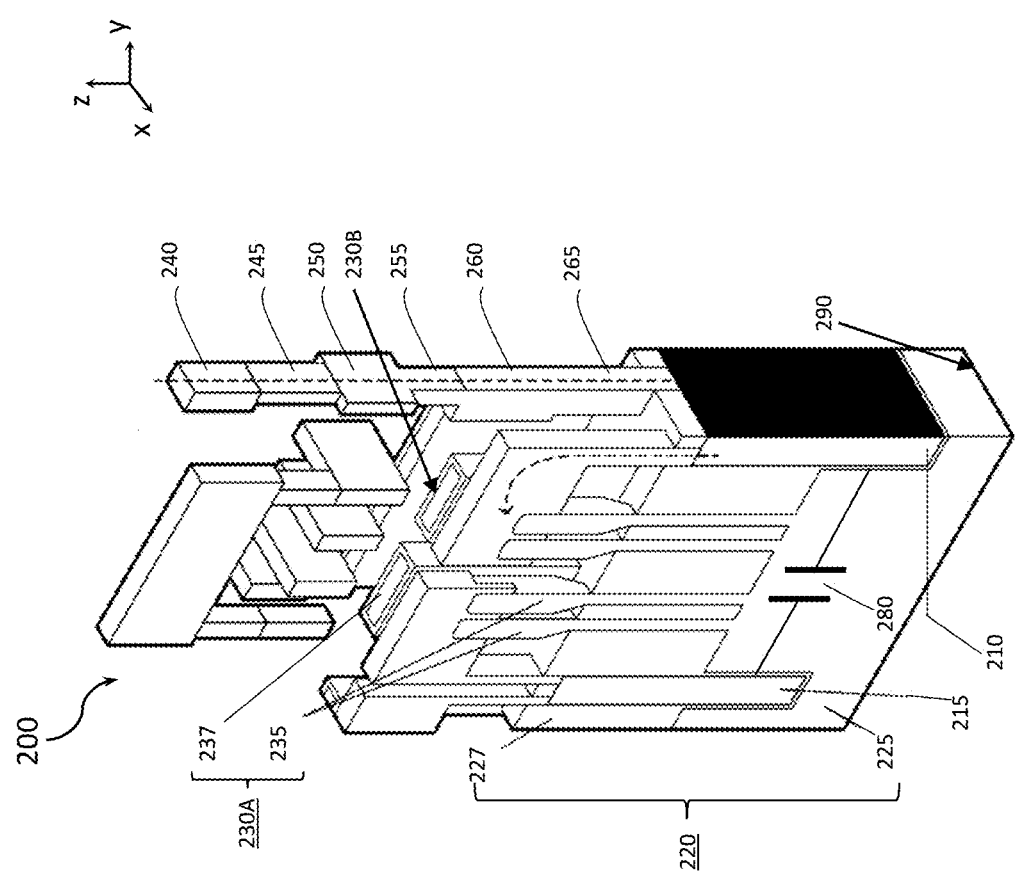
FIG. 2 is a perspective view of an example IC device including BPRs integrated with a decoupling capacitance, according to some embodiments of the disclosure.

FIG. 2 is a perspective view of an example IC device 200 including BPRs 210 and 215 integrated with a decoupling capacitance 280, according to some embodiments of the disclosure. The IC device 200 also includes a support structure 220 where the BPRs 210 and 215 are buried, transistors 230A-B (collectively referred to as "transistors 230" or "transistor 230"), electrically conductive layers 240, 250, and 260, and vias 245, 255, and 265. In other embodiments, the IC device 200 may include more, fewer, or different components. In some embodiments, the components of the IC device 200 may be arranged differently. For instance, the electrically conductive layer 240 may be arranged below the support structure 220 for backside power delivery.

A transistor 230 includes semiconductor structures 235 (individually referred to as "semiconductor structure 235") and a gate 237. A semiconductor structure 235 may be a fin, nanoribbon, or nanowire of a semiconductor material. In some embodiments, at least a portion of a semiconductor structure 235 are formed in the support structure 220. The gate 237 has a first portion at least partially wrapping around a portion of a semiconductor structure 235 on a source region of the transistor 230. The gate 237 also has a second portion at least partially wrapping around a portion of another semiconductor structure 235 on a drain region of the transistor 230. An embodiment of the gate 237 is the gate stack 108 in FIGS. 1-3. A transistor 230 may be a NMOS or PMOS transistor.

The support structure 220 includes a semiconductor layer 225 and an insulator layer 227. A portion of each BPR 210 or 215 is buried in the semiconductor layer 225, and the remaining portion of the BPR 210 or 215 is buried in the insulator layer 227. The semiconductor layer 225 includes a semiconductor material. Examples of the semiconductor material include, for example, single crystal silicon, polycrystalline silicon, silicon-on-insulator (SOI), other suitable semiconductor material, or some combination thereof. The semiconductor layer 225 may also include other materials, such as metal, dielectric, dopant, and so on. In FIG. 2, the semiconductor layer 225 has a top surface and a bottom surface. The top surface of the semiconductor layer 225 contacts with the bottom surface of the insulator layer 227. The bottom surface of the semiconductor layer 225 is the bottom surface of the IC device 200 and can be referred to as the backside of the IC device 200. In some embodiments, the semiconductor layer 225, or a portion of it, is dopped to generate a p-type support structure or n-type support structure.

The insulator layer 227 functions as an electrical insulator that isolates conducting and semiconducting materials from each other. In some embodiments, the insulator layer 227 is an oxide layer. An example oxide layer is a layer of silicon oxide, $SiO_x$, where x is an integer number, such as 2, 2, etc. The insulator layer 227 adjoins the semiconductor layer 225. As shown in FIG. 2, the insulator layer 227 is above the semiconductor layer 225. In some embodiments, the insulator layer 427 is not a continuous insulator layer. Rather, the insulator layer 227 includes discrete insulator sections arranged in the semiconductor material of the semiconductor layer 225. The discrete insulator sections can insulate BPRs from the semiconductor material. The discrete insulator sections can also insulate semiconductor structures, which are formed in the semiconductor layer 225, of transistors from each other. The discrete insulator sections may include an oxide of the semiconductor material and can be formed from portions of the semiconductor layer 225.

In some embodiments, the insulator layer 227 may be formed by transforming a portion of a silicon support structure into silicon oxide. Silicon exposed to ambient conditions has a native oxide on its surface. The native oxide is approximately 3 nm thick at room temperature. However, 3 nm may be too thin for most applications and a thicker insulator layer needs to be grown. This is done by consuming the underlying Si to form SiOx. This is a grown layer. It is also possible to grow SiOx by a chemical vapor deposition process using Si and O precursor molecules. In this embodiment, the underlying Si in the wafer is not consumed. This is called a deposited layer. In some embodiments, the insulator layer 227 helps in protecting the components in the support structure 220 from contamination, both physical and chemical. Thus, it acts as a passivating layer. The insulator layer 227 can protect the components in the support structure 220 from scratches and it also prevents dust from interacting with the components in the support structure 220, and thus minimizes contamination. The insulator layer 227 also protects the components in the support structure 220 from chemical impurities, mainly electrically active contaminants. SiOx acts as a hard mask for doping and as an etch stop during patterning.

The BPRs 210 and 215 are electrically conductive. The BPRs 210 and 215 are coupled to one or more power sources and to semiconductor devices in the IC device 200 (such as the transistors 230) to provide power to the semiconductor devices. In FIG. 2, the two BPRs 210 and 215 are buried in the support structure 220. A portion of each BPR 210 or 215 is buried in the insulator layer 227. The remaining portion of each BPR 210 or 215 is buried in the semiconductor layer 225. The BPRs 210 and 215 may be made of a metal, such as tungsten (W), ruthenium (Ru), cobalt (Co), other metals, or some combination thereof. Each BPR 210 or 215 may include a dielectric barrier on its surface that touches the semiconductor layer 225. The dielectric barrier can insulate the metal in the BPR 210 or 215 from the semiconductor material of the semiconductor layer 225. The dielectric barrier may be an oxide barrier made from an oxide material.

The electrically conductive layers 240, 250, and 260 are built in the IC device 200 to provide power and signal to the semiconductor devices in the IC device 200. An electrically conductive layer is a layer comprising an electrically conductive material, e.g., metal. In an embodiment, the electrically conductive layers 240 and 260 are used for power delivery but the electrically conductive layer 250 is used for signal delivery. In some embodiments, the electrically conductive layer 260 is referred to as "MO," the electrically conductive layer 250 is referred to as "Mint," and the electrically conductive layer 260 is referred to as "Ml," given the sequence of producing the electrically conductive layers 240, 250, and 260 in the process of fabricating the IC device 200. The electrically conductive layers 240, 250, and 260 can be made of copper or other types of metals. Each electrically conductive layer 240, 250, or 260 includes multiple sections that can be separated and insulated from each other.

The BPRs 210 and 215, electrically conductive layers 240, 250, and 260, and vias 245, 255, and 265 constitute a conducting path for power delivery network, as indicated by the dotted line in FIG. 2. The vias 245, 255, and 265 are conducting. In one embodiment, some or all of the vias 245, 255, and 265 are made of copper or other types of metal. The vias 245 are between the electrically conductive layers 240 and 250 to couple the two electrically conductive layers 240 and 250 to each other. As shown in FIG. 2, there are three vias 245 between the electrically conductive layers 240 and 250. Each via 245 is for coupling a section of the electrically conductive layer 240 to a corresponding section of the electrically conductive layer 250. In other embodiments, there can be fewer or more vias 245 to couple the electrically conductive layers 240 and 250. Similarly, the via 255 is between the electrically conductive layers 250 and 260. The vias 265 couple the BPRs 210 and 215 to the electrically conductive layer 260. In FIG. 2, there are two vias 265 connecting the BPR 210 to the electrically conductive layer 260 and two vias 265 connecting the BPR 215 to the electrically conductive layer 260. The electrically conductive layer 260 is coupled to the transistors 230, particularly to semiconductor structures 235 of the transistors 230.

In an example, the electrically conductive layer 240 functions as the power plane of the IC device 200. A positive or negative voltage, for example, can be provided to the electrically conductive layer 240 so that the BPR 210 is electrically biased. The BPR 215 is grounded so that there is an electric potential difference between the BPRs 210 and 215, which transfers to the electric potential difference between the transistors 230. As the electrically conductive layer 240 is on top of the transistors 230, the power delivery network is called "frontside power delivery network." In other embodiments, the IC device 200 may include an electrically conductive layer below the transistors 230, e.g., at the backside of the IC device 200. The electrically conductive layer may function as the power plane, ground plane, or both to form "backside power delivery network". The BPRs 210 and 215 can be coupled to the electrically conductive layer by TSVs. A TSV is a via inside the support structure 200. The TSVs are below the BPRs 210 and 215 and buried in the semiconductor layer 225 of the support structure 220. The TSVs may be micro-TSVs or nano-TSVs. The power delivery network of the IC device 200 can be a network of interconnect that is separate from the signal network. For instance, portions of the electrically conductive layer 250 that are not in the power delivery network can be used to deliver signals.

In FIG. 2, the power delivery path also includes the decoupling capacitance 280, which is integrated with the BPRs 210 and 215. The decoupling capacitance 280 stabilizes the power supply facilitated by the BPRs 210 and 215. In some embodiments, the decoupling capacitance 280 is based on the BPRs 210 and 215. For instance, the BPRs 210 and 215 function as electrodes for the decoupling capacitance 280. A dielectric element is present between the BPRs 210 and 215. The dielectric element may include the dielectric barriers of the BPRs 210 and 215 and may also include additional dielectric. Additionally or alternatively, the decoupling capacitance 280 is based on a capacitor arranged below the support structure 220. The bottom surface 290 of the support structure 220 defines the backside of the support structure. The capacitor may be placed in a backside layer adjoining the support structure 220, particularly the bottom surface 290. The capacitor may include planar electrodes or interdigital electrodes. In various embodiments, the decoupling capacitance 280 has a capacitance value per BPR length of 1 fF/um at least.

In some embodiments, the IC device 200 is fabricated through a sequence of processes. Well formation is done as the first step. The first step comprises, for example, ion implantation and dopant activation anneal. Alternatively, well formation can be done after the fin reveal step. Subsequently, fin patterning and insulator layer formation are carried out. The insulator layer formation step may include silicon oxide deposition, silicon oxide anneal, and chemical mechanical polishing (CMP). The BPRs 210 and 215 are formed in the next step, which includes patterning BPR trench into the support structure 220. Subsequently, a dielectric barrier may be deposited onto the outer surfaces of the BPRs 210 and 215 (i.e., the surfaces touching the support structure 220) to electrically isolate the BPRs 210 and 215 from the support structure 220. In some embodiments, the step of forming the BPRs 210 and 215 may further include metal CMP and silicon oxide anneal. Next, fin reveal is carried out, e.g., by etching, to reveal the fins. After that, the electrically conductive layers 240, 250, and 260 and vias 245, 255, and 265 are integrated into the IC device 200.

Figure 3:
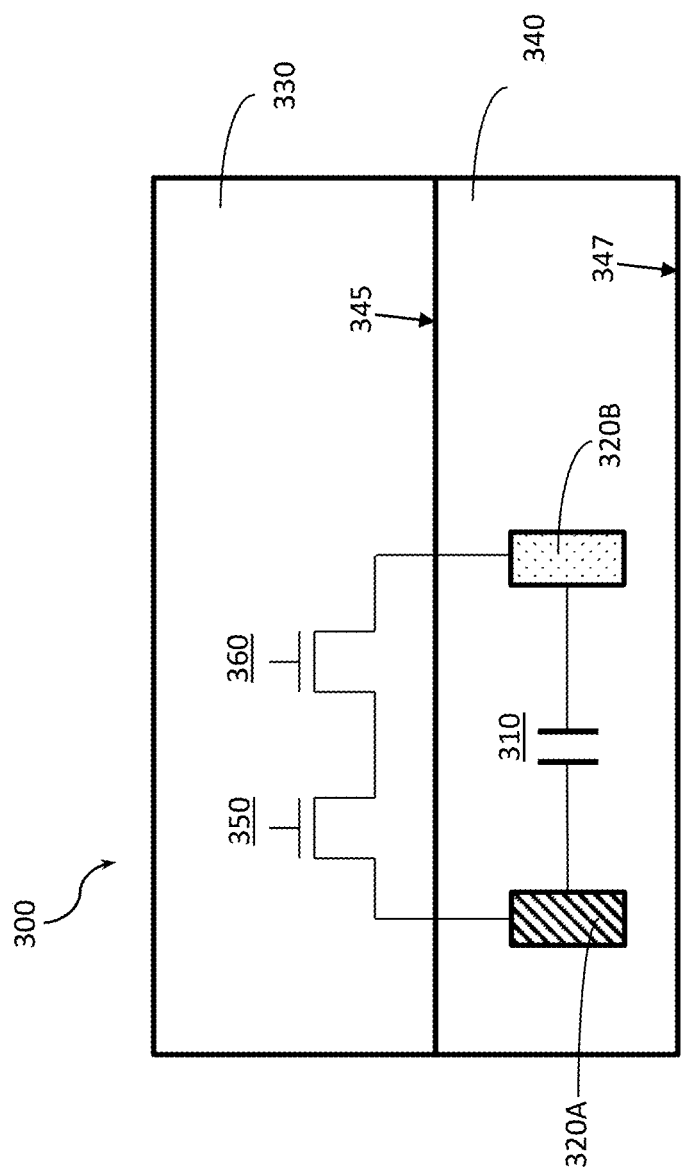
FIG. 3 illustrates an example IC device including a decoupling capacitor based on BPRs, according to some embodiments of the disclosure.

FIG. 3 illustrates an example IC device 300 including a decoupling capacitance 310 based on BPRs 320A-B, according to some embodiments of the disclosure. The IC device 300 also includes a layer 330, a support structure 340, and transistors 350 and 360. In other embodiments, the IC device 300 may also include other components, such as electrically conductive layers.

The layer 330 includes the transistors 350 and 360. In an embodiment, the transistor 350 is a NMOS transistor. The transistor 360 is a PMOS transistor. In other embodiments, the transistors 350 and 360 may be other types of transistors, such as bipolar transistors. An embodiment of the transistor 350 or 360 is the FinFET 100 in FIG. 1 or the transistor 230 in FIG. 2. Even though FIG. 3 shows that the whole transistor 350 or 360 is in the layer 330. In some embodiments, a transistor includes semiconductor structures in the support structure 340.

The support structure 340 includes a semiconductor material, such as silicon. The support structure 340 may be a layer of the semiconductor material. The support structure 340 facilitates formation of semiconductor structures of transistors, e.g., the transistors 350 and 360. A semiconductor structure may be a fin, nanoribbon, nanowire, or a planar structure of a semiconductor material. In some embodiments, a semiconductor structure is formed by doping a section of the support structure 340.

The support structure 340 includes two surfaces 345 and 347. The surface 347 opposes the surface 345. The side of the support structure 340 from the surface 345 upwards is referred to as the frontside, and side of the support structure 340 from the surface 347 downwards is referred to as the backside of the support structure 340. Various layers can be arranged in the frontside and backside of the support structure 340. In the embodiment of FIG. 3, the layer 330 is at the frontside of the support structure 340 and adjoins the support structure 340, particularly a surface 345 of the support structure 340.

The support structure 340 includes the BPRs 320A-B (collectively referred to as "BPRs 320" or "BPR 320"). The BPRs 320 are coupled to power and ground planes (not shown in FIG. 3) of the IC device 300. The BPRs 320 are coupled to the transistors 350 and 360, e.g., by vias. That way, the BPRs 320 facilitate a conducting path from the power/ground plane to the transistors 350 and 360. A BPR may include a conductive core and a dielectric barrier. The conductive core is a core including an electrical conductor, such as metal. The dielectric barrier is a barrier including a dielectric material, such as an oxide material. The dielectric barrier covers at least part of the conductive core to insulate the conductive core from the semiconductor material of the support structure 340.

The decoupling capacitance 310 is based on the BPRs 320. For instance, the conductive cores of the BPRs 320 function as electrodes for the decoupling capacitance 310 and the dielectric barriers of the BPRs 320 function as dielectric for the decoupling capacitance 310. In some embodiments, an additional dielectric element is arranged between the BPRs 320 to increase the value of the decoupling capacitance 310. The decoupling capacitance 310 has a capacitance value per BPR length of 1 fF/um at least. In some embodiments, the decoupling capacitance 310 has a capacitance value per area of approximately 10 fF/um$^2$. As the decoupling capacitance 310 is based on the BPRs 320, it is on the conducting path to the transistors 350 and 360 and can stabilize power supply to the transistors 350 and 360.

Figure 4:
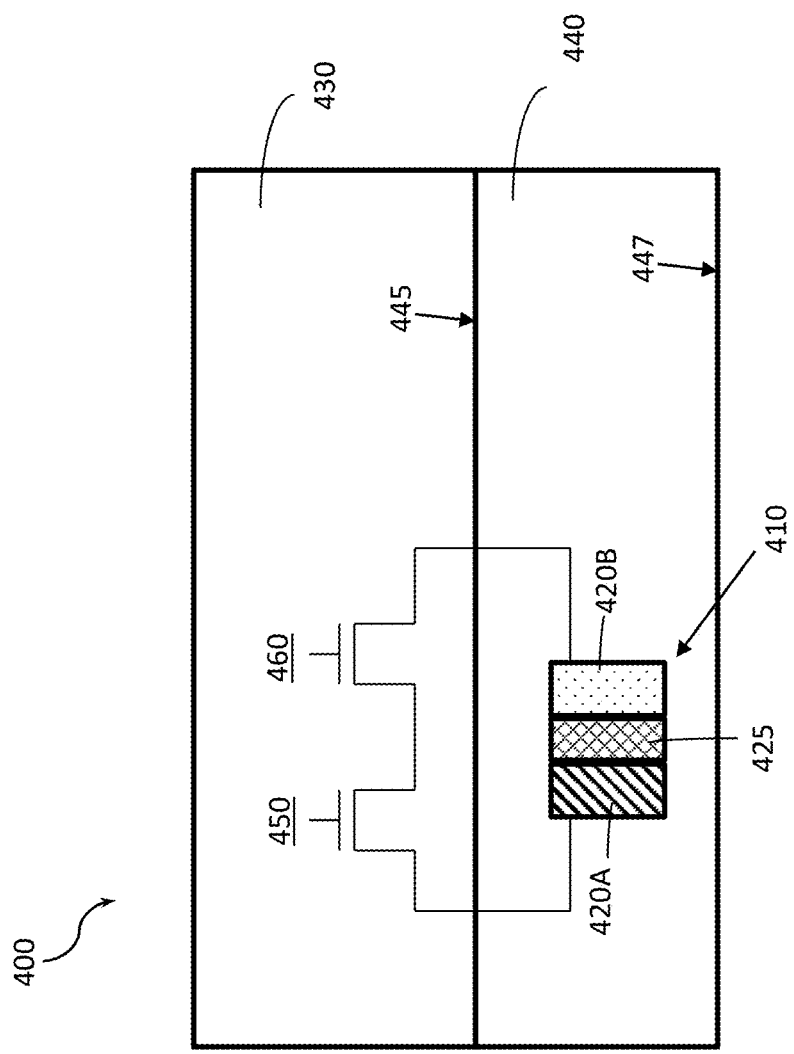
FIG. 4 illustrates another example IC device including a decoupling capacitor based on BPRs, according to some embodiments of the disclosure.

FIG. 4 illustrates another example IC device 400 including a decoupling capacitor 410 based on BPRs 420A-B, according to some embodiments of the disclosure. The IC device 400 is an embodiment of the IC device 300 in FIG. 3. The IC device 400 also includes a layer 430, a support structure 440, and transistors 450 and 460. In other embodiments, the IC device 400 may also include other components, such as electrically conductive layers.

The layer 430 includes the transistors 450 and 460. In an embodiment, the transistor 450 is a NMOS transistor. The transistor 460 is a PMOS transistor. In other embodiments, the transistors 450 and 460 may be other types of transistors, such as bipolar transistors. An embodiment of the transistor 450 or 460 is the FinFET 100 in FIG. 1 or the transistor 230 in FIG. 2. Even though FIG. 4 shows that the whole transistor 450 or 460 is in the layer 430. In some embodiments, a transistor includes semiconductor structures in the support structure 440.

The support structure 440 may be the same as or similar to the support structure 340 in FIG. 3. The support structure 440 includes two surfaces 445 and 447. The surface 447 opposes the surface 445. The side of the support structure 440 from the surface 445 upwards is referred to as the frontside, and side of the support structure 440 from the surface 447 downwards is referred to as the backside of the support structure 440. Various layers can be arranged in the frontside and backside of the support structure 440. In the embodiment of FIG. 4, the layer 430 is at the frontside of the support structure 440 and adjoins the support structure 440, particularly a surface 445 of the support structure 440.

The support structure 440 includes the BPRs 420A-B (collectively referred to as "BPRs 420" or "BPR 420"). The BPRs 420 are coupled to power and ground planes (not shown in FIG. 4) of the IC device 400. The BPRs 420 are coupled to the transistors 450 and 460, e.g., by vias. That way, the BPRs 420 facilitate a conducting path from the power/ground plane to the transistors 450 and 460. The BPRs 420 may be the same as or similar to the BPRs 320 in FIG. 3.

The decoupling capacitor 410 is in the support structure 440 and is based on the BPRs 420. The decoupling capacitor 410 includes the BPRs 420 and a dielectric element 425. The dielectric element 425 is between the BPRs 420. The dielectric element 425 includes a dielectric material, such as an oxide material. The dielectric element 425 includes a first surface adjoining the BPR 420A and a second surface adjoining the BPR 420B. The first and second surfaces of the dielectric element are in parallel. A distance from the first surface to the second surface is in a range from 1 to 3 nanometers. The dielectric element together with the dielectric barriers of the BPRs 420 constitute the capacitor insulator of the decoupling capacitor 410. The conductive cores of the BPRs 420 constitute the capacitor electrodes of the decoupling capacitor 410. In some embodiments, the decoupling capacitor 410 has a capacitance value per BPR length of 1 fF/um at least. In some embodiments, the decoupling capacitor 410 has a capacitance value per area of approximately 10 fF/um$^2$.

Figure 5:
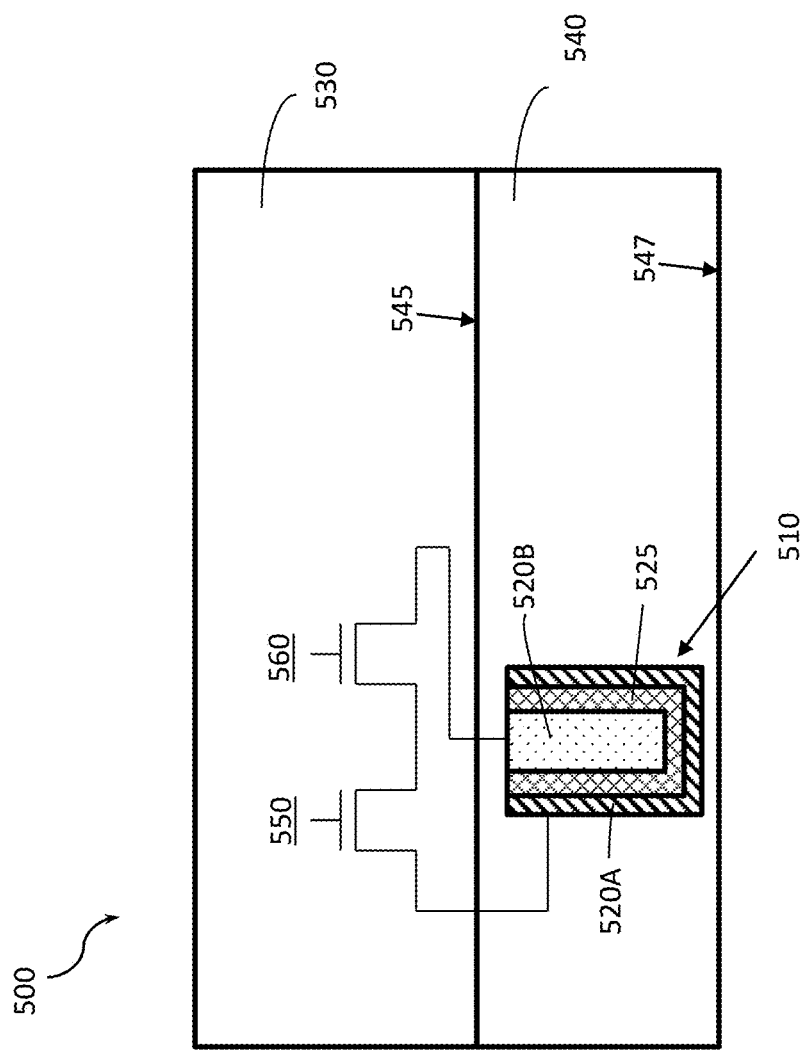
FIG. 5 illustrates yet another example IC device including a decoupling capacitor based on BPRs, according to some embodiments of the disclosure.

FIG. 5 illustrates yet another example IC device 500 including a decoupling capacitor 510 based on BPRs 520, according to some embodiments of the disclosure. The IC device 500 is an embodiment of the IC devicer 300 in FIG. 3. The IC device 500 also includes a layer 530, a support structure 540, and transistors 550 and 560. In other embodiments, the IC device 500 may also include other components, such as electrically conductive layers.

The layer 530 includes the transistors 550 and 560. In an embodiment, the transistor 550 is a NMOS transistor. The transistor 560 is a PMOS transistor. In other embodiments, the transistors 550 and 560 may be other types of transistors, such as bipolar transistors. An embodiment of the transistor 550 or 560 is the FinFET 100 in FIG. 1 or the transistor 230 in FIG. 2. Even though FIG. 5 shows that the whole transistor 550 or 560 is in the layer 530. In some embodiments, a transistor includes semiconductor structures in the support structure 540.

The support structure 540 may be the same as or similar to the support structure 340 in FIG. 3. The support structure 540 includes two surfaces 545 and 547. The surface 547 opposes the surface 545. The side of the support structure 540 from the surface 545 upwards is referred to as the frontside, and side of the support structure 540 from the surface 547 downwards is referred to as the backside of the support structure 540. Various layers can be arranged in the frontside and backside of the support structure 540. In the embodiment of FIG. 5, the layer 530 is at the frontside of the support structure 540 and adjoins the support structure 540, particularly a surface 545 of the support structure 540.

The support structure 540 includes the BPRs 520A-B (collectively referred to as "BPRs 520" or "BPR 520"). The BPRs 520 are coupled to power and ground planes (not shown in FIG. 5) of the IC device 500. The BPRs 520 are coupled to the transistors 550 and 560, e.g., by vias. That way, the BPRs 520 facilitate a conducting path from the power/ground plane to the transistors 550 and 560. The BPRs 420 may be the same as or similar to the BPRs 320 in FIG. 3. The decoupling capacitor 510 is in the support structure 540. The decoupling capacitor 510 is based on the BPRs 520.

The decoupling capacitor 510 includes the BPRs 520 and a dielectric element 525. The dielectric element 525 is between the BPRs 520. The dielectric element 525 includes a dielectric material, such as an oxide material. The dielectric element 525 includes a first surface adjoining the BPR 520A and a second surface adjoining the BPR 520B. As shown in FIG. 5, the BPR 520A encloses the dielectric element 525, and the dielectric element 525 encloses the BPR 520B. The BPR 520A has a hollow structure. At least part of the dielectric element 525 and at least part of the BPR 520B are inside the hollow structure. Also, at least part of the BPR 520B the dielectric element 525 is inside a hollow structure of the dielectric element 525. The dielectric element 525 together with the dielectric barriers of the BPRs 520 constitute the capacitor insulator of the decoupling capacitor 510. The conductive cores of the BPRs 520 constitute the capacitor electrodes of the decoupling capacitor 510. In some embodiments, the decoupling capacitor 510 has a capacitance value per BPR length of 1 fF/um at least. In some embodiments, the decoupling capacitor 510 has a capacitance value per area of approximately 10 fF/um$^2$.

Figure 6:
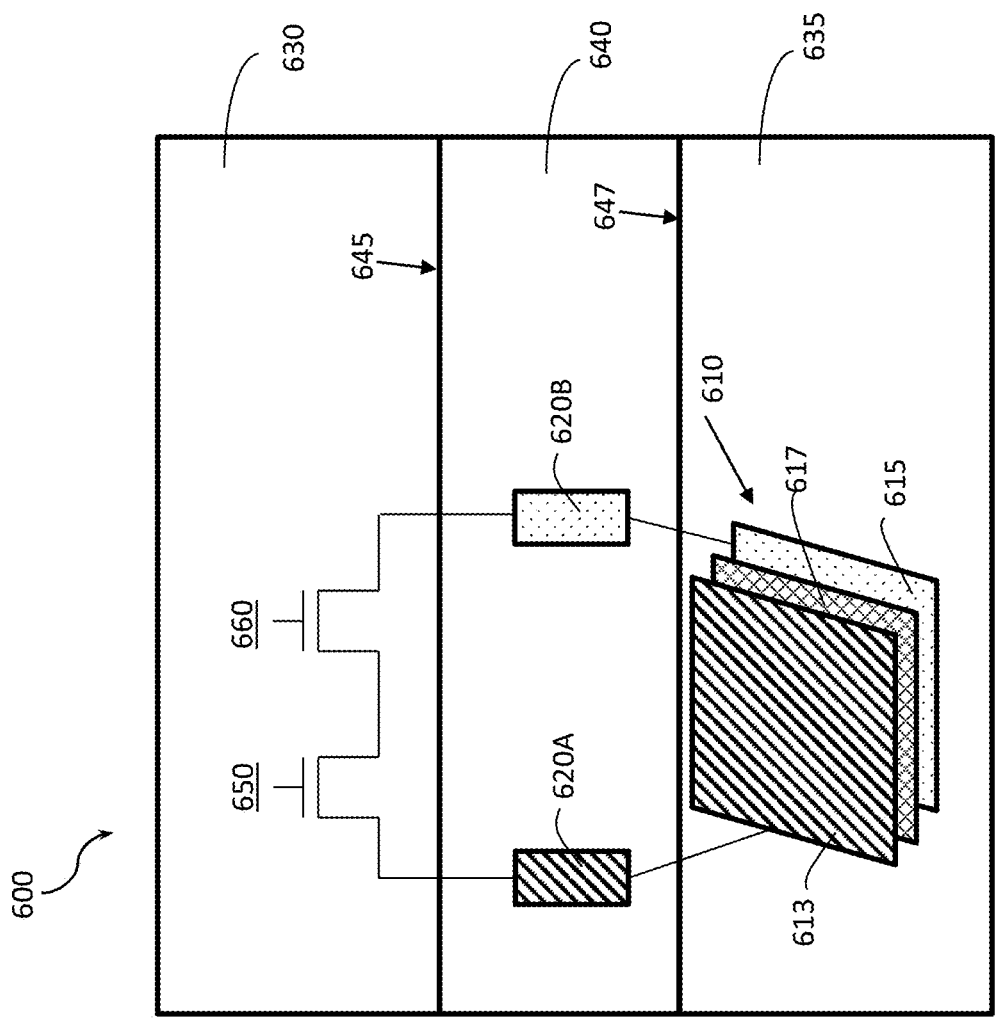
FIG. 6 illustrates an example IC device including a decoupling capacitor coupled to BPRs, according to some embodiments of the disclosure.

FIG. 6 illustrates an example IC device 600 including a decoupling capacitor 610 coupled to BPRs 620, according to some embodiments of the disclosure. The IC device 600 also includes a first layer 630, a second layer 635, a support structure 640 between the first layer 630 and second layer 635. In other embodiments, the IC device 600 may also include other components, such as electrically conductive layers.

The first layer 630 includes the transistors 650 and 660. In an embodiment, the transistor 650 is a NMOS transistor. The transistor 660 is a PMOS transistor. In other embodiments, the transistors 650 and 660 may be other types of transistors, such as bipolar transistors. An embodiment of the transistor 650 or 660 is the FinFET 100 in FIG. 1 or the transistor 230 in FIG. 2. Even though FIG. 6 shows that the whole transistor 650 or 660 is in the first layer 630. In some embodiments, a transistor includes semiconductor structures in the support structure 640.

The support structure 640 may be the same as or similar to the support structure 340 in FIG. 3. The support structure 640 includes two surfaces 646 and 647. The surface 647 opposes the surface 645. The side of the support structure 640 from the surface 645 upwards is referred to as the frontside, and side of the support structure 640 from the surface 647 downwards is referred to as the backside of the support structure 640. Various layers can be arranged in the frontside and backside of the support structure 640. In the embodiment of FIG. 6, the first layer 630 is at the frontside of the support structure 640 and adjoins the surface 645 of the support structure 640. The second layer 635 is at the backside of the support structure 640 and adjoins the surface 647 of the support structure 640.

The support structure 640 includes the BPRs 620A-B (collectively referred to as "BPRs 620" or "BPR 620"). The BPRs 620 are coupled to power and ground planes (not shown in FIG. 6) of the IC device 600. The BPRs 620 are coupled to the transistors 660 and 660, e.g., by vias. That way, the BPRs 620 facilitate a conducting path from the power/ground plane to the transistors 660 and 660. The BPRs 420 may be the same as or similar to the BPRs 320 in FIG. 3.

Figure 7:
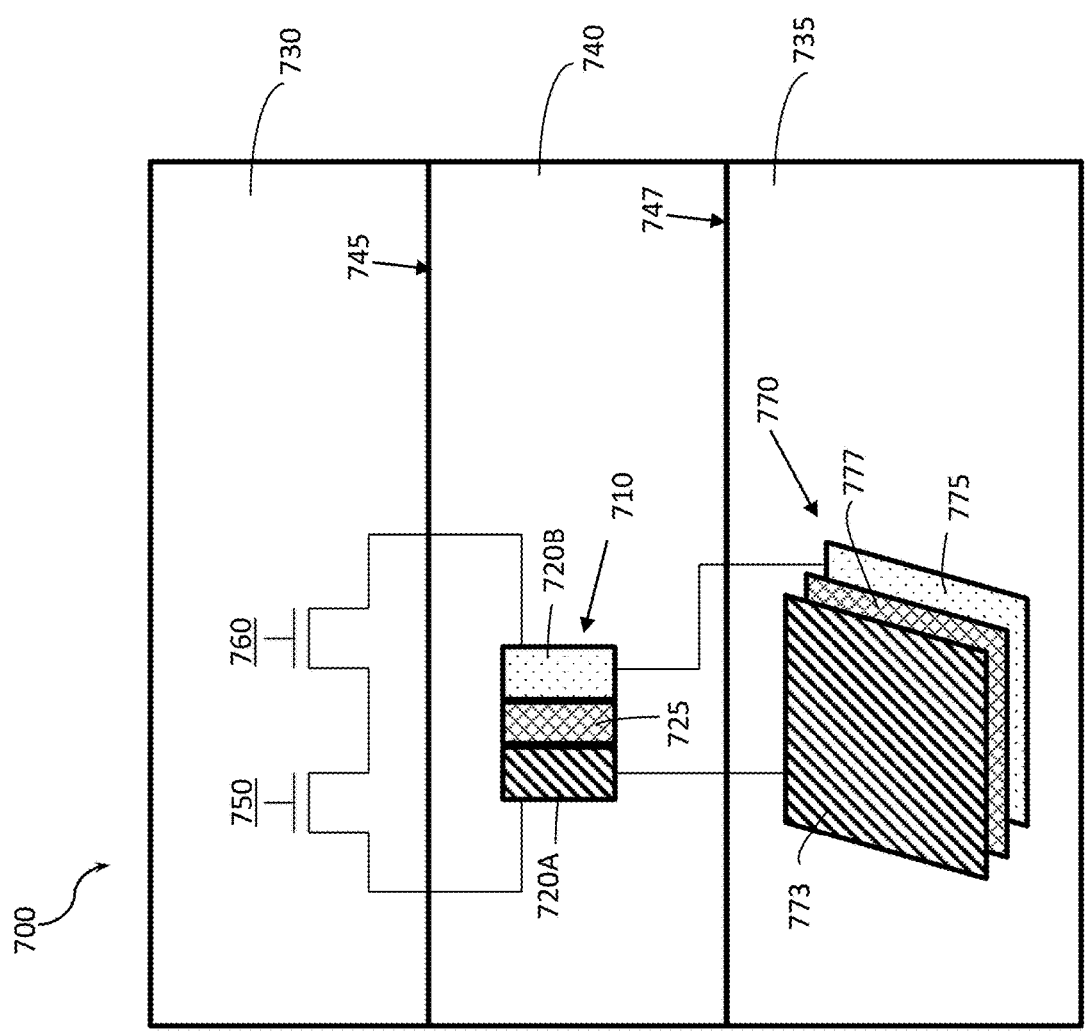
FIG. 7 illustrates an example IC device including a first decoupling capacitor based on BPRs and a second decoupling capacitor coupled to the BPRs, according to some embodiments of the disclosure.

The second layer 635 includes the decoupling capacitor 610. The decoupling capacitor 610 includes the capacitor electrodes 613 and 615 and a capacitor insulator 617. The capacitor insulator 617 is between the BPRs 620. A capacitor electrode 613 or 615 includes an electrically conductive material, such as metal. The capacitor insulator 617 is an electrical insulator and includes a dielectric material, such as an oxide material. The decoupling capacitor 610 is a planar capacitor. The capacitor insulator 617 includes a first surface adjoining the capacitor electrode 613 and a second surface adjoining the capacitor electrode 615. The first and second surfaces of the capacitor insulator 617 are in parallel. A distance from the first surface to the second surface may be in a range from 1 to 3 nanometers. In some embodiments, the decoupling capacitor 610 has a capacitance value per unit length of 1 fF/um at least. In some embodiments, the decoupling capacitor 610 has a capacitance value per unit area of approximately 10 fF/um$^2$. The BPRs 620 are coupled to the decoupling capacitor 610, e.g., by vias in the support structure 640. As shown in FIG. 7, the BPR 620A is coupled to the capacitor electrode 613, and the BPR 620B is coupled to the capacitor electrode 615. Thus, the decoupling capacitor 610 can stabilize power supply facilitated by the BPRs 620.

FIG. 7 illustrates an example IC device 700 including a first decoupling capacitor 710 based on BPRs 720A-B and a second decoupling capacitor 770 coupled to the BPRs 720A-B, according to some embodiments of the disclosure. The IC device 700 also includes a first layer 730, a second layer 735, a support structure 740 between the first layer 730 and second layer 735. In other embodiments, the IC device 700 may also include other components, such as electrically conductive layers.

The first layer 730 includes the transistors 750 and 760. In an embodiment, the transistor 750 is a NMOS transistor. The transistor 760 is a PMOS transistor. In other embodiments, the transistors 750 and 760 may be other types of transistors, such as bipolar transistors. An embodiment of the transistor 750 or 760 is the FinFET 100 in FIG. 1 or the transistor 270 in FIG. 2. Even though FIG. 7 shows that the whole transistor 750 or 760 is in the first layer 730. In some embodiments, a transistor includes semiconductor structures in the support structure 740.

The support structure 740 may be the same as or similar to the support structure 340 in FIG. 3. The support structure 740 includes two surfaces 747 and 747. The surface 747 opposes the surface 745. The side of the support structure 740 from the surface 745 upwards is referred to as the frontside, and side of the support structure 740 from the surface 747 downwards is referred to as the backside of the support structure 740. Various layers can be arranged in the frontside and backside of the support structure 740. In the embodiment of FIG. 7, the first layer 730 is at the frontside of the support structure 740 and adjoins the surface 745 of the support structure 740. The second layer 735 is at the backside of the support structure 740 and adjoins the surface 747 of the support structure 740.

The support structure 740 includes the BPRs 720A-B (collectively referred to as "BPRs 720" or "BPR 720"). The BPRs 720 are coupled to power and ground planes (not shown in FIG. 7) of the IC device 700. The BPRs 720 are coupled to the transistors 750 and 760, e.g., by vias. That way, the BPRs 720 facilitate a conducting path from the power/ground plane to the transistors 750 and 760. The BPRs 420 may be the same as or similar to the BPRs 320 in FIG. 3. The decoupling capacitor 710 is in the support structure 740 and is based on the BPRs 720. The decoupling capacitor 710 includes the BPRs 720 and a dielectric element 725. The dielectric element 725 is between the BPRs 720. The decoupling capacitor 710 is an embodiment of the decoupling capacitor 410 in FIG. 4.

The second layer 735 includes the decoupling capacitor 770. The decoupling capacitor 770 includes the capacitor electrodes 773 and 775 and a capacitor insulator 777. The capacitor insulator 777 is between the BPRs 720. A capacitor electrode 773 and 775 includes an electrically conductive material. The capacitor insulator 777 is an electrical insulator and includes a dielectric material, such as an oxide material. The decoupling capacitor 770 is an embodiment of the decoupling capacitor 610 in FIG. 6. As The BPRs 720 are electrodes of the decoupling capacitor 710 and are coupled to the decoupling capacitor 770, e.g., by vias in the support structure 740, the decoupling capacitors 710 and 770 can stabilize power supply facilitated by the BPRs 720.

Figure 8:
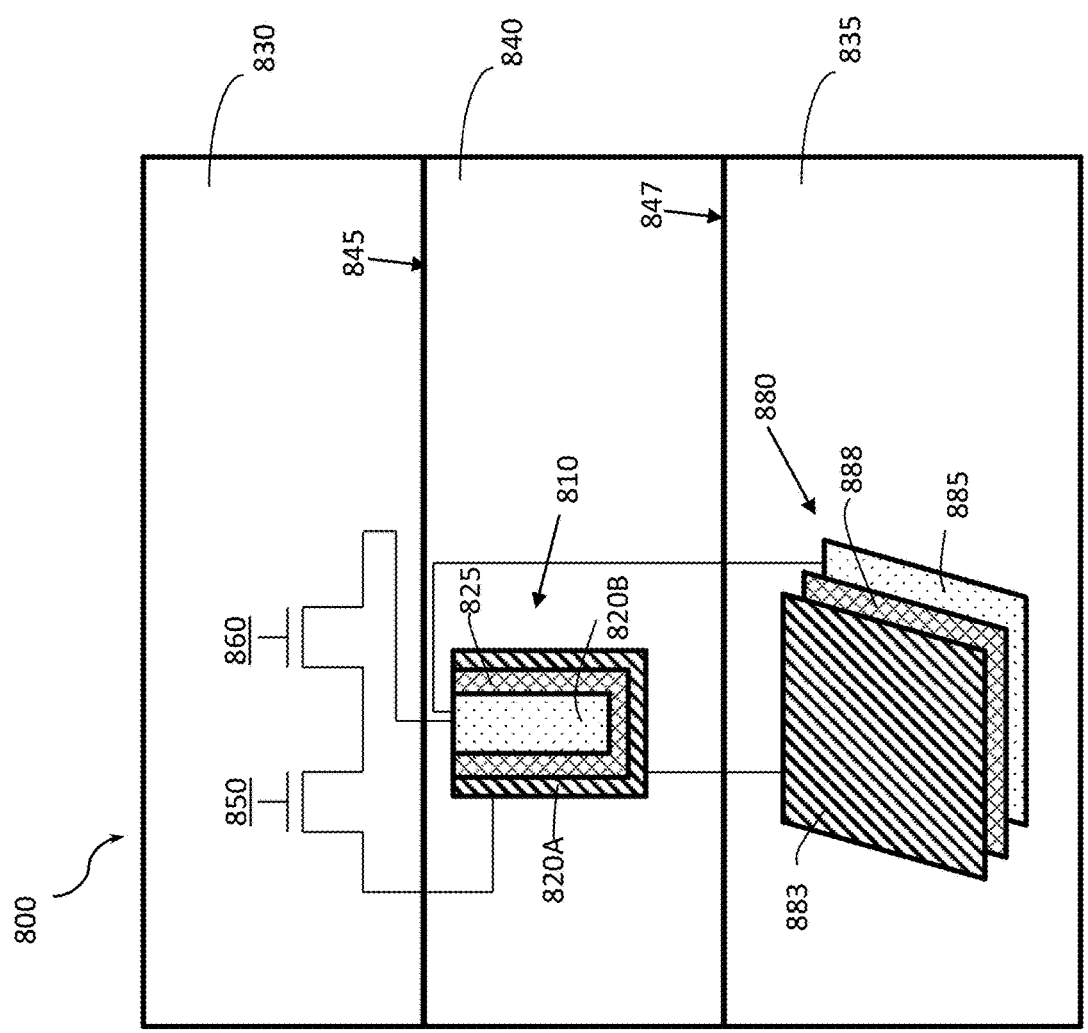
FIG. 8 illustrates another example IC device including a first decoupling capacitor based on BPRs and a second decoupling capacitor coupled to the BPRs, according to some embodiments of the disclosure.

FIG. 8 illustrates another example IC device 800 including a first decoupling capacitor 810 based on BPRs 820A-B and a second decoupling capacitor 870 coupled to the BPRs 820A-B, according to some embodiments of the disclosure. The IC device 800 also includes a first layer 830, a second layer 835, a support structure 840 between the first layer 830 and second layer 835. In other embodiments, the IC device 800 may also include other components, such as electrically conductive layers.

The first layer 830 includes the transistors 850 and 860. In an embodiment, the transistor 850 is a NMOS transistor. The transistor 860 is a PMOS transistor. In other embodiments, the transistors 850 and 860 may be other types of transistors, such as bipolar transistors. An embodiment of the transistor 850 or 860 is the FinFET 100 in FIG. 1 or the transistor 230 in FIG. 2. Even though FIG. 8 shows that the whole transistor 850 or 860 is in the first layer 830. In some embodiments, a transistor includes semiconductor structures in the support structure 840.

The support structure 840 may be the same as or similar to the support structure 340 in FIG. 3. The support structure 840 includes two surfaces 848 and 848. The surface 848 opposes the surface 845. The side of the support structure 840 from the surface 845 upwards is referred to as the frontside, and side of the support structure 840 from the surface 848 downwards is referred to as the backside of the support structure 840. Various layers can be arranged in the frontside and backside of the support structure 840. In the embodiment of FIG. 8, the first layer 830 is at the frontside of the support structure 840 and adjoins the surface 845 of the support structure 840. The second layer 835 is at the backside of the support structure 840 and adjoins the surface 848 of the support structure 840.

The support structure 840 includes the BPRs 820A-B (collectively referred to as "BPRs 820" or "BPR 820"). The BPRs 820 are coupled to power and ground planes (not shown in FIG. 8) of the IC device 800. The BPRs 820 are coupled to the transistors 850 and 860, e.g., by vias. That way, the BPRs 820 facilitate a conducting path from the power/ground plane to the transistors 850 and 860. The BPRs 820 may be the same as or similar to the BPRs 320 in FIG. 3. The decoupling capacitor 810 is in the support structure 840 and is based on the BPRs 820. The decoupling capacitor 810 includes the BPRs 820 and a dielectric element 825. The dielectric element 825 is between the BPRs 820. The decoupling capacitor 810 is an embodiment of the decoupling capacitor 510 in FIG. 5.

The second layer 835 includes the decoupling capacitor 880. The decoupling capacitor 880 includes the capacitor electrodes 883 and 885 and a capacitor insulator 888. The capacitor insulator 888 is between the BPRs 820. The capacitor insulator 888 includes a dielectric material, such as an oxide material. The decoupling capacitor 880 is an embodiment of the decoupling capacitor 610 in FIG. 6. As The BPRs 820 are electrodes of the decoupling capacitor 810 and are coupled to the decoupling capacitor 880, e.g., by vias in the support structure 840, the decoupling capacitors 810 and 880 can stabilize power supply facilitated by the BPRs 820.

Figure 9:
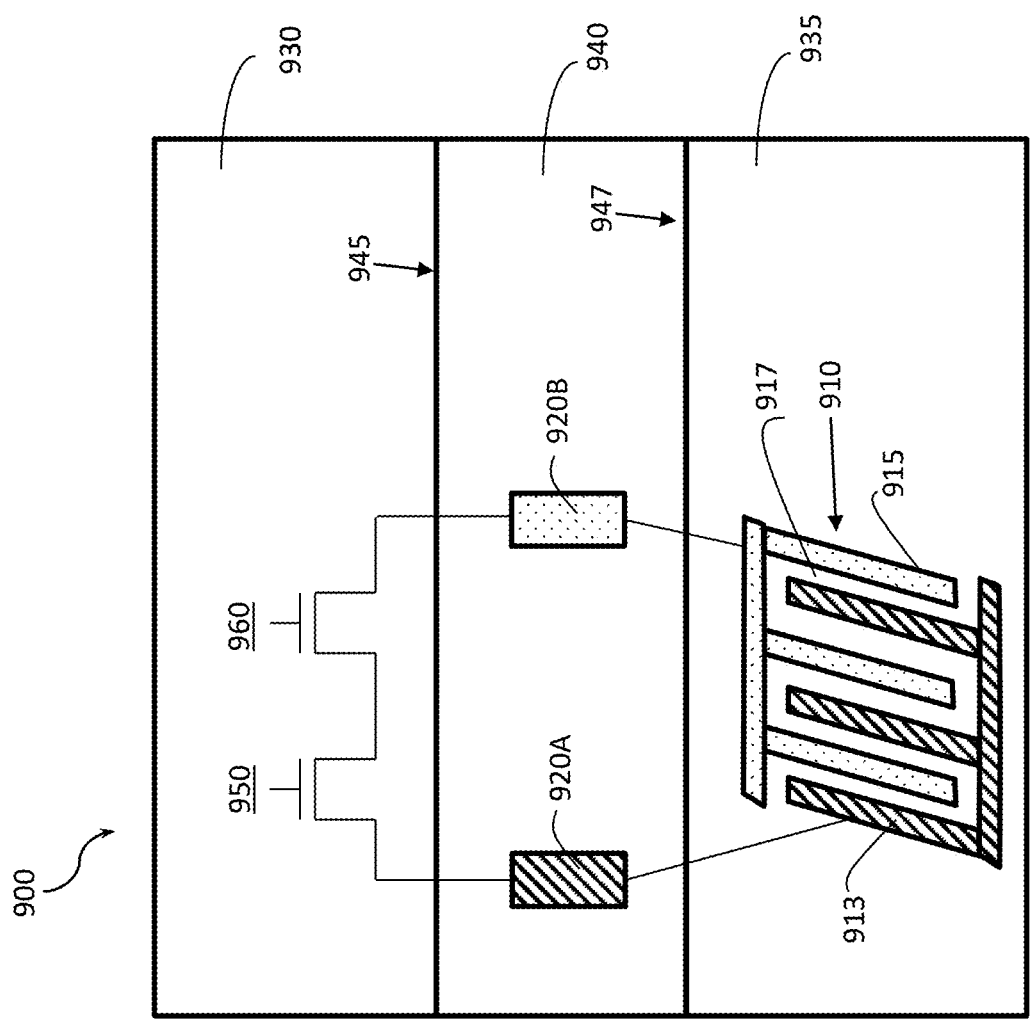
FIG. 9 illustrates an example IC device including an interdigital decoupling capacitor coupled to BPRs, according to some embodiments of the disclosure.

FIG. 9 illustrates an example IC device 900 including an interdigital decoupling capacitor 910 coupled to BPRs 920A-B, according to some embodiments of the disclosure. The IC device 900 also includes a first layer 930, a second layer 935, a support structure 940 between the first layer 930 and second layer 935. In other embodiments, the IC device 900 may also include other components, such as electrically conductive layers.

The first layer 930 includes the transistors 950 and 960. In an embodiment, the transistor 950 is a NMOS transistor. The transistor 960 is a PMOS transistor. In other embodiments, the transistors 950 and 960 may be other types of transistors, such as bipolar transistors. An embodiment of the transistor 950 or 960 is the FinFET 100 in FIG. 1 or the transistor 230 in FIG. 2. Even though FIG. 9 shows that the whole transistor 950 or 960 is in the first layer 930. In some embodiments, a transistor includes semiconductor structures in the support structure 940.

The support structure 940 may be the same as or similar to the support structure 340 in FIG. 3. The support structure 940 includes two surfaces 949 and 947. The surface 947 opposes the surface 945. The side of the support structure 940 from the surface 945 upwards is referred to as the frontside, and side of the support structure 940 from the surface 947 downwards is referred to as the backside of the support structure 940. Various layers can be arranged in the frontside and backside of the support structure 940. In the embodiment of FIG. 9, the first layer 930 is at the frontside of the support structure 940 and adjoins the surface 945 of the support structure 940. The second layer 935 is at the backside of the support structure 940 and adjoins the surface 947 of the support structure 940.

The support structure 940 includes the BPRs 920A-B (collectively referred to as "BPRs 920" or "BPR 920"). The BPRs 920 are coupled to power and ground planes (not shown in FIG. 9) of the IC device 900. The BPRs 920 are coupled to the transistors 950 and 960, e.g., by vias. That way, the BPRs 920 facilitate a conducting path from the power/ground plane to the transistors 950 and 960. The BPRs 420 may be the same as or similar to the BPRs 320 in FIG. 3.

The second layer 935 includes the decoupling capacitor 910. The decoupling capacitor 910 includes the capacitor electrodes 913 and 915 and a capacitor insulator 917. The capacitor insulator 917 is between the BPRs 920. The capacitor insulator 917 includes a dielectric material, such as an oxide material. The decoupling capacitor 910 is an interdigital capacitor, which has an interdigital pattern. As shown in FIG. 9, the capacitor electrode 913 includes three conductive fingers and the capacitor electrode 915 also includes three conductive fingers. In other embodiments, a capacitor electrode may include a different number of conductive fingers. The conductive fingers of a capacitor electrode are coupled to each other but insulated from the capacitor electrodes of the other capacitor electrode. The conductive fingers of the capacitor electrode 913 alternate with the conductive fingers of the capacitor electrode 915. The conductive fingers are in parallel and a portion of the capacitor insulator 917 is between two adjacent conductive fingers.

In some embodiments, the decoupling capacitor 910 has a capacitance value per unit length of 1 fF/um at least. In some embodiments, the decoupling capacitor 910 has a capacitance value per unit area of approximately 10 fF/um$^2$. The BPRs 920 are coupled to the decoupling capacitor 910, e.g., by vias in the support structure 940. As shown in FIG. 9, the BPR 920A is coupled to the capacitor electrode 913, and the BPR 920B is coupled to the capacitor electrode 915. Thus, the decoupling capacitor 910 can stabilize power supply facilitated by the BPRs 920.

Figure 10:
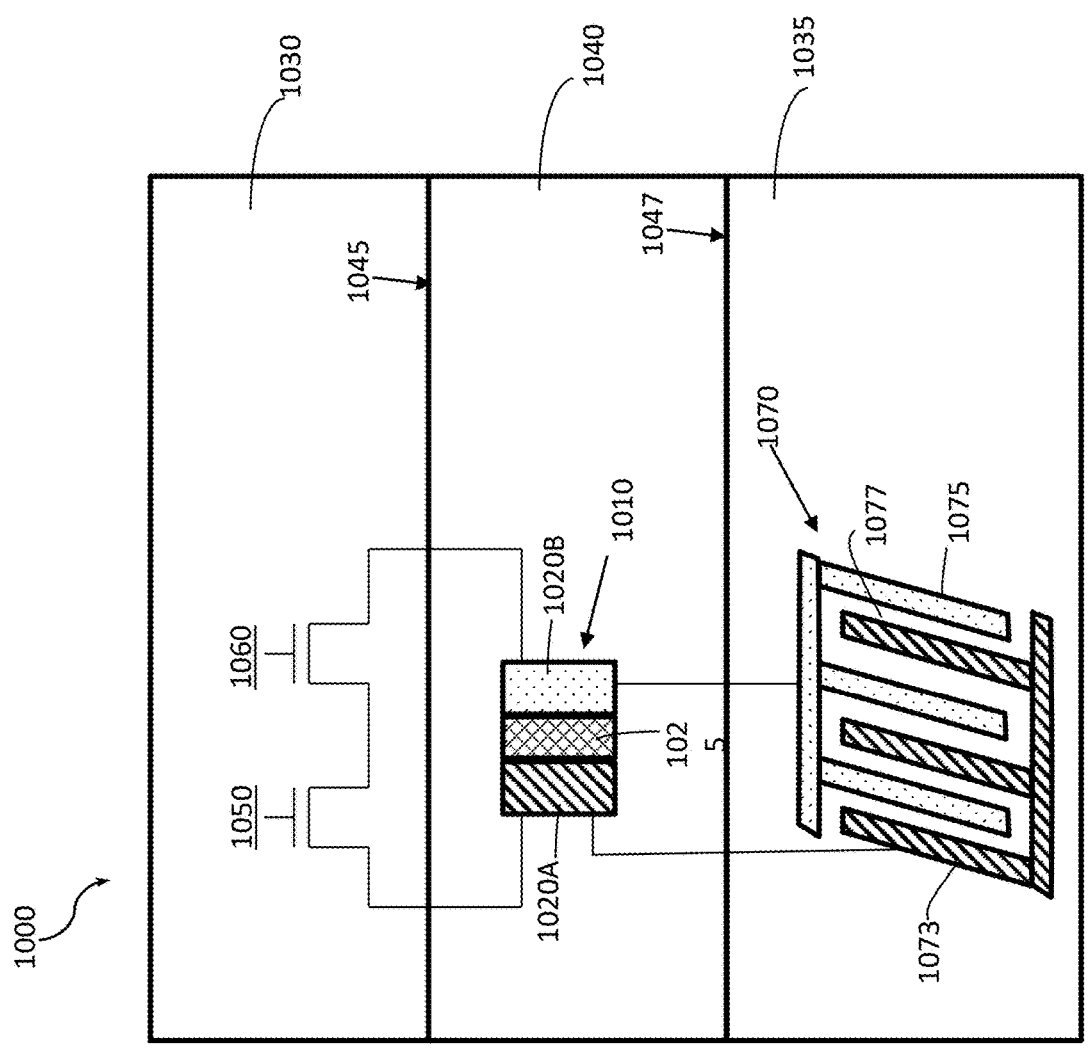
FIG. 10 illustrates an example IC device including a first decoupling capacitor based on BPRs and a second interdigital decoupling capacitor coupled to the BPRs, according to some embodiments of the disclosure.

FIG. 10 illustrates an example IC device including a first decoupling capacitor 1010 based on BPRs 1020A-B and a second interdigital decoupling capacitor 1070 coupled to the BPRs 1020A-B, according to some embodiments of the disclosure. The IC device 1000 also includes a first layer 1030, a second layer 1035, a support structure 1040 between the first layer 1030 and second layer 1035. In other embodiments, the IC device 1000 may also include other components, such as electrically conductive layers.

The first layer 1030 includes the transistors 1050 and 1060. In an embodiment, the transistor 1050 is a NMOS transistor. The transistor 1060 is a PMOS transistor. In other embodiments, the transistors 1050 and 1060 may be other types of transistors, such as bipolar transistors. An embodiment of the transistor 1050 or 1060 is the FinFET 100 in FIG. 1 or the transistor 270 in FIG. 2. Even though FIG. 10 shows that the whole transistor 1050 or 1060 is in the first layer 1030. In some embodiments, a transistor includes semiconductor structures in the support structure 1040.

The support structure 1040 may be the same as or similar to the support structure 340 in FIG. 3. The support structure 1040 includes two surfaces 1045 and 1047. The surface 1047 opposes the surface 1045. The side of the support structure 1040 from the surface 1045 upwards is referred to as the frontside, and side of the support structure 1040 from the surface 1047 downwards is referred to as the backside of the support structure 1040. Various layers can be arranged in the frontside and backside of the support structure 1040. In the embodiment of FIG. 10, the first layer 1030 is at the frontside of the support structure 1040 and adjoins the surface 1045 of the support structure 1040. The second layer 1035 is at the backside of the support structure 1040 and adjoins the surface 1047 of the support structure 1040.

The support structure 1040 includes the BPRs 1020A-B (collectively referred to as "BPRs 1020" or "BPR 1020"). The BPRs 1020 are coupled to power and ground planes (not shown in FIG. 10) of the IC device 1000. The BPRs 1020 are coupled to the transistors 1050 and 1060, e.g., by vias. That way, the BPRs 1020 facilitate a conducting path from the power/ground plane to the transistors 1050 and 1060. The BPRs 420 may be the same as or similar to the BPRs 320 in FIG. 3. The decoupling capacitor 1010 is in the support structure 1040 and is based on the BPRs 1020. The decoupling capacitor 1010 includes the BPRs 1020 and a dielectric element 1025. The dielectric element 1025 is between the BPRs 1020. The decoupling capacitor 1010 is an embodiment of the decoupling capacitor 410 in FIG. 4.

The second layer 1035 includes the decoupling capacitor 1070. The decoupling capacitor 1070 includes the capacitor electrodes 1073 and 1075 and a capacitor insulator 1077. The capacitor insulator 1077 is between the BPRs 1020. The capacitor insulator 1077 includes a dielectric material, such as an oxide material. The decoupling capacitor 1070 is an interdigital capacitor. The decoupling capacitor 1070 is an embodiment of the decoupling capacitor 910 in FIG. 9. As The BPRs 1020 are electrodes of the decoupling capacitor 1010 and are coupled to the decoupling capacitor 1070, e.g., by vias in the support structure 1040, the decoupling capacitors 1010 and 1070 can stabilize power supply facilitated by the BPRs 1020.

Figure 11:
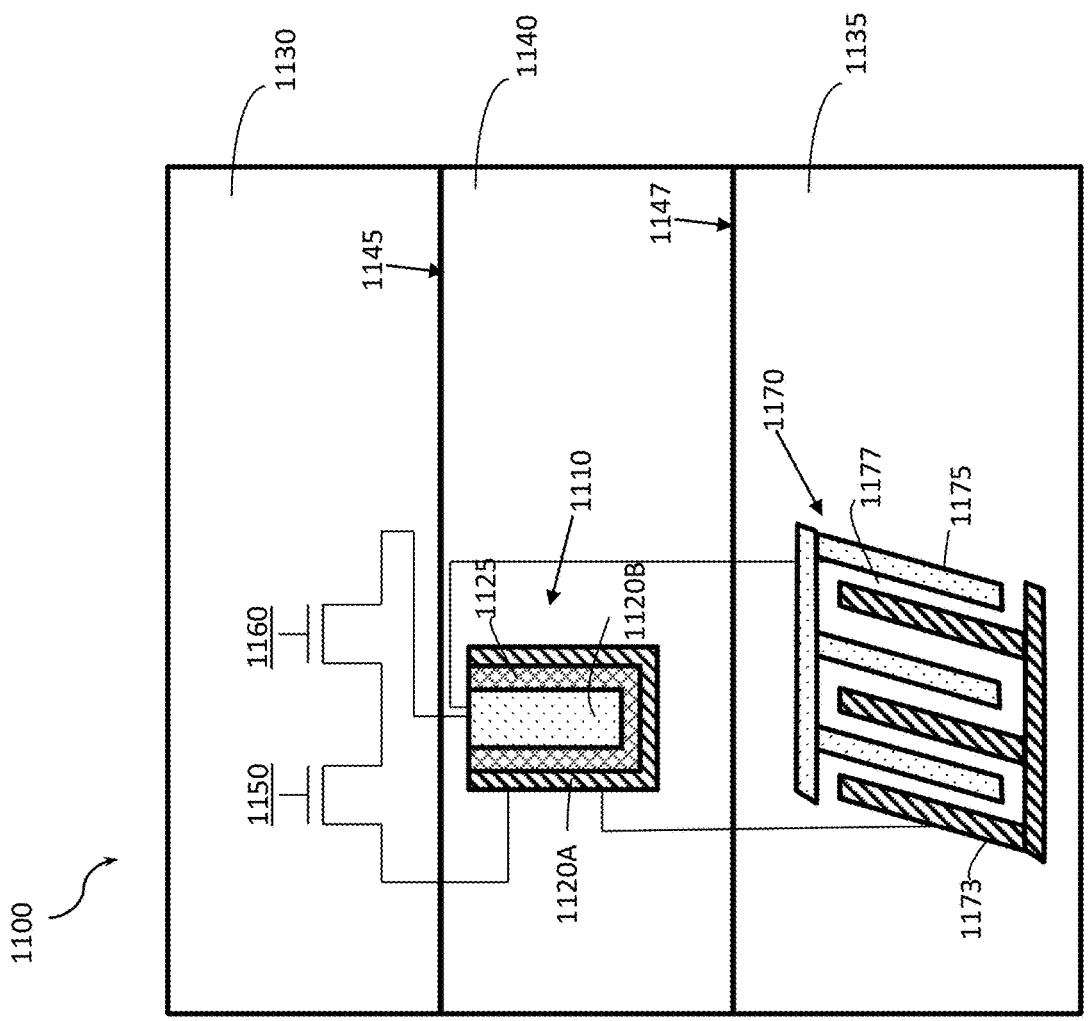
FIG. 11 illustrates yet another example IC device including a first decoupling capacitor based on BPRs and a second interdigital decoupling capacitor coupled to the BPRs, according to some embodiments of the disclosure.

FIG. 11 illustrates yet another example IC device 1100 including a first decoupling capacitor 1110 based on BPRs 1120A-B and a second interdigital decoupling capacitor 1170 coupled to the BPRs 1120A-B, according to some embodiments of the disclosure. The IC device 1100 also includes a first layer 1130, a second layer 1135, a support structure 1140 between the first layer 1130 and second layer 1135. In other embodiments, the IC device 1100 may also include other components, such as electrically conductive layers.

The first layer 1130 includes the transistors 1150 and 1160. In an embodiment, the transistor 1150 is a NMOS transistor. The transistor 1160 is a PMOS transistor. In other embodiments, the transistors 1150 and 1160 may be other types of transistors, such as bipolar transistors. An embodiment of the transistor 1150 or 1160 is the FinFET 100 in FIG. 1 or the transistor 270 in FIG. 2. Even though FIG. 11 shows that the whole transistor 1150 or 1160 is in the first layer 1130. In some embodiments, a transistor includes semiconductor structures in the support structure 1140.

The support structure 1140 may be the same as or similar to the support structure 340 in FIG. 3. The support structure 1140 includes two surfaces 1145 and 1147. The surface 1147 opposes the surface 1145. The side of the support structure 1140 from the surface 1145 upwards is referred to as the frontside, and side of the support structure 1140 from the surface 1147 downwards is referred to as the backside of the support structure 1140. Various layers can be arranged in the frontside and backside of the support structure 1140. In the embodiment of FIG. 11, the first layer 1130 is at the frontside of the support structure 1140 and adjoins the surface 1145 of the support structure 1140. The second layer 1135 is at the backside of the support structure 1140 and adjoins the surface 1147 of the support structure 1140.

The support structure 1140 includes the BPRs 1120A-B (collectively referred to as "BPRs 1120" or "BPR 1120"). The BPRs 1120 are coupled to power and ground planes (not shown in FIG. 11) of the IC device 1100. The BPRs 1120 are coupled to the transistors 1150 and 1160, e.g., by vias. That way, the BPRs 1120 facilitate a conducting path from the power/ground plane to the transistors 1150 and 1160. The BPRs 420 may be the same as or similar to the BPRs 320 in FIG. 3. The decoupling capacitor 1110 is in the support structure 1140 and is based on the BPRs 1120. The decoupling capacitor 1110 includes the BPRs 1120 and a dielectric element 1125. The dielectric element 1125 is between the BPRs 1120. The decoupling capacitor 1110 is an embodiment of the decoupling capacitor 510 in FIG. 5.

The second layer 1135 includes the decoupling capacitor 1170. The decoupling capacitor 1170 includes the capacitor electrodes 1173 and 1175 and a capacitor insulator 1177. The capacitor insulator 1177 is between the BPRs 1120. The capacitor insulator 1177 includes a dielectric material, such as an oxide material. The decoupling capacitor 1170 is an interdigital decoupling capacitor. The decoupling capacitor 1170 is an embodiment of the decoupling capacitor 910 in FIG. 9. As the BPRs 1120 are electrodes of the decoupling capacitor 1110 and are coupled to the decoupling capacitor 1170, e.g., by vias in the support structure 1140, the decoupling capacitors 1110 and 1170 can stabilize power supply facilitated by the BPRs 1120.

Figure 12A:
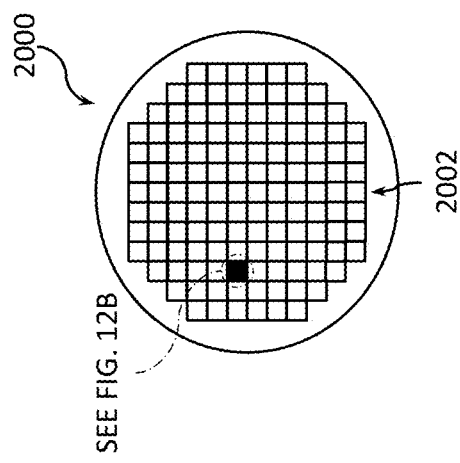
FIGS. 12A-12B are top views of a wafer and dies that may include one or more BPRs with integrated decoupling capacitance, according to some embodiments of the disclosure.
Figure 12B:
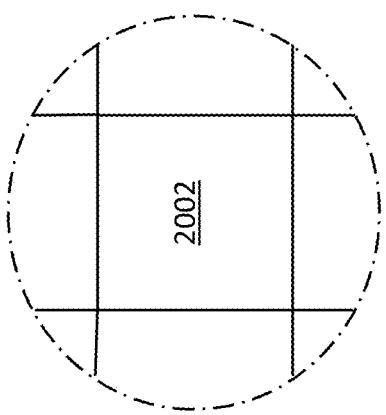

FIGS. 12A-12B are top views of a wafer 2000 and dies 2002 that may include one or more BPRs with integrated decoupling capacitance, according to some embodiments of the disclosure. In some embodiments, the dies 2002 may be included in an IC package, according to some embodiments of the disclosure. For example, any of the dies 2002 may serve as any of the dies 2256 in an IC package 2200 shown in FIG. 13. The wafer 2000 may be composed of semiconductor material and may include one or more dies 2002 having IC devices formed on a surface of the wafer 2000. Each of the dies 2002 may be a repeating unit of a semiconductor product that includes any suitable IC (e.g., ICs including one or more BPRs as described herein). After the fabrication of the semiconductor product is complete (e.g., after manufacture of one or more BPRs as described herein), the wafer 2000 may undergo a singulation process in which each of the dies 2002 is separated from one another to provide discrete "chips" of the semiconductor product. In particular, devices that include one or more BPRs as disclosed herein may take the form of the wafer 2000 (e.g., not singulated) or the form of the die 2002 (e.g., singulated). The die 2002 may include one or more diodes (e.g., one or more BPRs as described herein), one or more transistors (e.g., one or more III-N transistors as described herein) as well as, optionally, supporting circuitry to route electrical signals to the III-N diodes with n-doped wells and capping layers and III-N transistors, as well as any other IC components. In some embodiments, the wafer 2000 or the die 2002 may implement an electrostatic discharge (ESD) protection device, an RF FE device, a memory device (e.g., a static random-access memory (SRAM) device), a logic device (e.g., an AND, OR, NAND, or NOR gate), or any other suitable circuit element. Multiple ones of these devices may be combined on a single die 2002.

Figure 13:
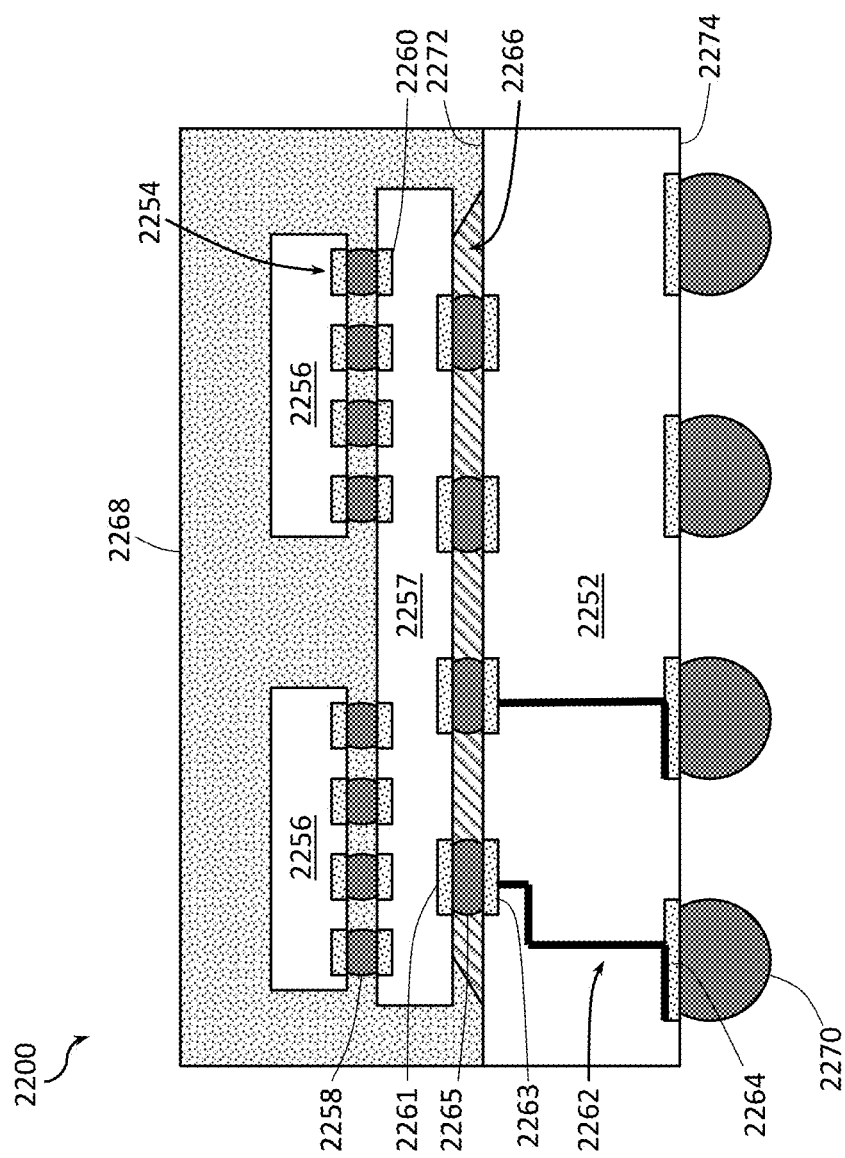
FIG. 13 is a side, cross-sectional view of an example IC package that may include one or more IC devices having BPRs with integrated decoupling capacitance, according to some embodiments of the disclosure.

FIG. 13 is a side, cross-sectional view of an example IC package 2200 that may include one or more IC devices having BPRs with integrated decoupling capacitance, according to some embodiments of the disclosure. In some embodiments, the IC package 2200 may be a system-in-package (SiP).

As shown in FIG. 13, the IC package 2200 may include a package substrate 2252. The package substrate 2252 may be formed of a dielectric material (e.g., a ceramic, a glass, a combination of organic and inorganic materials, a buildup film, an epoxy film having filler particles therein, etc., and may have embedded portions having different materials), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 13 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 13 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 13 are solder balls (e.g., for a ball grid array arrangement), but any suitable second-level interconnects 22770 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 14.

The dies 2256 may take the form of any of the embodiments of the die 2002 discussed herein and may include any of the embodiments of an IC device having one or more BPRs. In embodiments in which the IC package 2200 includes multiple dies 2256, the IC package 2200 may be referred to as a multi-chip package. Importantly, even in such embodiments of an MCP implementation of the IC package 2200, one or more BPRs may be provided in a single chip, in accordance with any of the embodiments described herein. The dies 2256 may include circuitry to perform any desired functionality. For example, one or more of the dies 2256 may be ESD protection dies, including one or more BPRs as described herein, one or more of the dies 2256 may be logic dies (e.g., silicon-based dies), one or more of the dies 2256 may be memory dies (e.g., high bandwidth memory), etc. In some embodiments, any of the dies 2256 may include one or more BPRs, e.g., as discussed above; in some embodiments, at least some of the dies 2256 may not include any III-N diodes with n-doped wells and capping layers.

The IC package 2200 illustrated in FIG. 13 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 13, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 14:
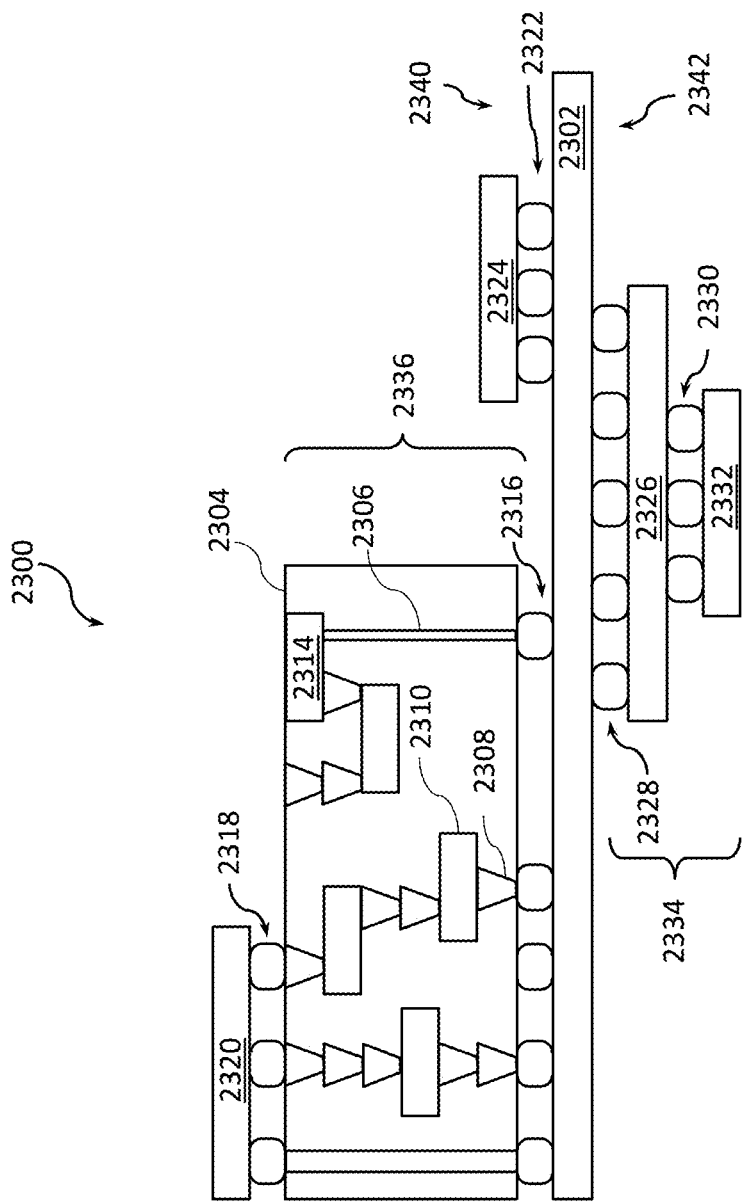
FIG. 14 is a cross-sectional side view of an IC device assembly that may include components having one or more IC devices implementing BPRs with integrated decoupling capacitance, according to some embodiments of the disclosure.

FIG. 14 is a cross-sectional side view of an IC device assembly 2300 that may include components having one or more IC devices implementing BPRs with integrated decoupling capacitance, according to some embodiments of the disclosure. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of the IC devices implementing one or more BPRs in accordance with any of the embodiments disclosed herein; e.g., any of the IC packages discussed below with reference to the IC device assembly 2300 may take the form of any of the embodiments of the IC package 2200 discussed above with reference to FIG. 13 (e.g., may include one or more BPRs in/on a die 2256).

In some embodiments, the circuit board 2302 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 14 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 14), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 12B), an IC device (e.g., the IC device of FIGS. 1-2), or any other suitable component. In particular, the IC package 2320 may include one or more BPRs as described herein. Although a single IC package 2320 is shown in FIG. 14, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 14, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to TSVs 2306. The interposer 2304 may further include embedded devices 2314, including both passive and active devices. Such devices may include, but are not limited to, capacitors, decoupling capacitors, resistors, inductors, fuses, diodes, transformers, sensors, ESD protection devices, and memory devices. More complex devices such as further RF devices, power amplifiers, power management devices, antennas, arrays, sensors, and microelectromechanical systems (MEMS) devices may also be formed on the interposer 2304. In some embodiments, the IC devices implementing one or more BPRs as described herein may also be implemented in/on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 14 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 15:
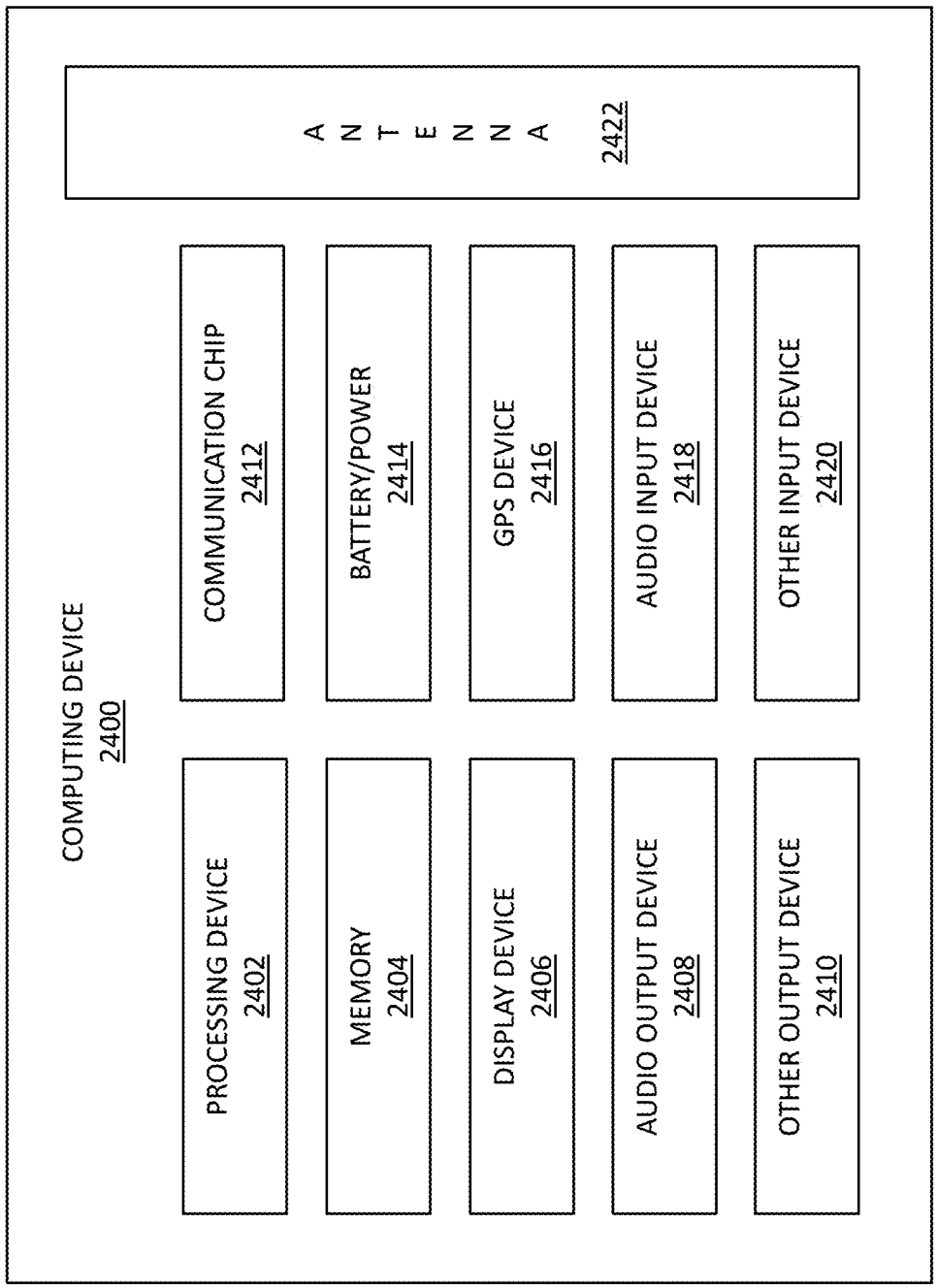
FIG. 15 is a block diagram of an example computing device that may include one or more components with BPRs with integrated decoupling capacitance, according to some embodiments of the disclosure.

FIG. 15 is a block diagram of an example computing device 2400 that may include one or more components with one or more IC devices having one or more BPRs, according to some embodiments of the disclosure. For example, any suitable ones of the components of the computing device 2400 may include a die (e.g., the die 2002 of FIG. 12B) including one or more BPRs, according to some embodiments of the disclosure. Any of the components of the computing device 2400 may include an IC device (e.g., any embodiment of the IC devices of FIGS. 1-4) and/or an IC package (e.g., the IC package 2200 of FIG. 13). Any of the components of the computing device 2400 may include an IC device assembly (e.g., the IC device assembly 2300 of FIG. 14).

A number of components are illustrated in FIG. 15 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC die.

Additionally, in various embodiments, the computing device 2400 may not include one or more of the components illustrated in FIG. 15, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid-state memory, and/or a hard drive. In some embodiments, the memory 2404 may include memory that shares a die with the processing device 2402. This memory may be used as cache memory and may include, e.g., eDRAM, and/or spin transfer torque magnetic random-access memory (STT-MRAM).

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

In various embodiments, IC devices having one or more BPRs as described herein may be particularly advantageous for use as part of ESD circuits protecting power amplifiers, low-noise amplifiers, filters (including arrays of filters and filter banks), switches, or other active components. In some embodiments, IC devices having one or more BPRs as described herein may be used in PMICs, e.g., as a rectifying diode for large currents. In some embodiments, IC devices having one or more BPRs as described herein may be used in audio devices and/or in various input/output devices.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

SELECT EXAMPLES

Example 1 provides an IC device, including: a support structure having a first surface and a second surface opposing the first surface; a first layer including at least a portion of a transistor and adjoining the first surface; a first buried power rail and a second buried power rail that are at least partially buried in the support structure and coupled to the transistor; and a second layer including a capacitor and adjoining the second surface, the capacitor including: a first capacitor electrode, a second capacitor electrode, and a capacitor insulator between the first capacitor electrode and the second capacitor electrode, where the first capacitor electrode is coupled to the first buried power rail, and the second capacitor electrode is coupled to the second buried power rail.

Example 2 provides the IC device according to example 1, where a capacitance of the capacitor per unit area of the IC device is at least 10 femto farad per square micrometer, or a capacitance of the capacitor per unit length of the first or second buried power rail is at least 1 femto farad per micrometer.

Example 3 provides the IC device according to example 1 or 2, where the first capacitor electrode is coupled to the first buried power rail by a via, and a least a portion of the via is inside the support structure.

Example 4 provides the IC device according to example 3, where the second capacitor electrode is coupled to the second buried power rail by an additional via, and at least a portion of the additional via is inside the support structure.

Example 5 provides the IC device according to example 4, where the support structure further includes an insulator material between the portion of the via and the portion of the additional via.

Example 6 provides the IC device according to any of the preceding examples, where: the first capacitor electrode includes a group of first conductive fingers; the second capacitor electrode includes a group of second conductive fingers; individual first conductive fingers alternate with individual second conductive fingers; and the capacitor insulator is between an individual first conductive finger and an individual second conductive finger.

Example 7 provides the IC device according to any of the preceding examples, where: the support structure includes an additional capacitor including a first additional capacitor electrode, a second additional capacitor electrode, and an additional capacitor insulator, the first buried power rail includes: a first barrier including a first electrical insulator, and a first core including a first electrical conductor and at least partially enclosed by the first barrier, the second buried power rail includes: a second barrier including a second electrical insulator, and a second core including a second electrical conductor and at least partially enclosed by the second barrier, the first additional capacitor electrode includes the first core, and the second additional capacitor electrode includes the second core.

Example 8 provides the IC device according to example 7, where the additional capacitor insulator includes a portion of the first barrier and a portion of the second barrier.

Example 9 provides the IC device according to example 8, where the additional capacitor insulator further includes an electrical insulator between the first buried power rail and the second buried power rail.

Example 10 provides the IC device according to any of the preceding examples, further including a power plane and a ground plane, the first buried power rail is coupled to the power plane, and the second buried power rail is coupled to the ground plane.

Example 11 provides an IC device, including: a support structure including a semiconductor material; a transistor over or at least partially in the support structure; a first buried power rail in the support structure, the first buried power rail coupled to the transistor; a second buried power rail in the support structure, the second buried power rail coupled to the transistor; and an electrical insulator between the first buried power rail and the second buried power rail, where the electrical insulator includes a first surface and a second surface, the first surface opposes the second surface, and a distance between the first surface and the second surface is in a range from 1 nanometer to 3 nanometers.

Example 12 provides the IC device according to example 11, where the first buried power rail or the second buried power rail includes: a core including an electrical conductor, and a barrier including an additional electrical insulator.

Example 13 provides the IC device according to example 11 or 12, where the first surface adjoins the first buried power rail, and the second surface adjoins the second buried power rail.

Example 14 provides the IC device according to any one of the examples 11-13, where the first buried power rail has a hollow structure, and at least part of the electrical insulator and the second buried power rail are inside the hollow structure.

Example 15 provides the IC device according to example 14, where the electrical insulator has an additional hollow structure, and at least part of the second buried power rail is inside the additional hollow structure.

Example 16 provides the IC device according to any one of the examples 11-15, further including an additional capacitor outside the support structure, the additional capacitor including: a first capacitor electrode coupled to the first buried power rail; a second capacitor electrode coupled to the second buried power rail; and a capacitor insulator between the first capacitor electrode and the second capacitor electrode.

Example 17 provides the IC device according to any one of the examples 11-16, where the first buried power rail, the second buried power rail, and the electrical insulator constitute a capacitor, and a capacitance of the capacitor per unit length of the first or second buried power rail is equal to or greater than 1 femto farad per micrometer.

Example 18 provides an IC device, including: a support structure having a first surface and an second surface opposing the first surface; a first elongated structure including a first electrically conductive material and having a longitudinal axis substantially parallel to the first surface or the second surface; a second elongated structure including a second electrically conductive material and having a longitudinal axis substantially parallel to the first surface or the second surface; a transistor over or at least partially in the support structure, the transistor coupled to the first elongated structure and the second elongated structure, where the transistor is closer to the first surface than the second surface; a first electrical conductor that is closer to the second surface than the first surface, the first electrical conductor coupled to the first elongated structure; a second electrical conductor that is closer to the second surface than the first surface, the second electrical conductor coupled to the second elongated structure; and an electrical insulator between the first electrical conductor and the second electrical conductor.

Example 19 provides the IC device according to example 18, where the first electrical conductor is coupled to the first elongated structure by a first via, at least a portion of the first via is inside the support structure, the second electrical conductor is coupled to the second elongated structure by a second via, and at least a portion of the second via is inside the support structure.

Example 20 provides the IC device according to example 18 or 19, where the support structure further includes an electrical insulator between the first elongated structure and the second elongated structure.

Example 21 provides an IC package, including the IC device according to any of the proceeding examples; and a further IC component, coupled to the IC device.

Example 22 provides the IC package according to example 21, where the further IC component includes one of a package substrate, an interposer, or a further IC die.

Example 23 provides the IC package according to example 21 or 22, where the IC device according to any one of examples 1-20 may include, or be a part of, at least one of a memory device, a computing device, a wearable device, a handheld electronic device, and a wireless communications device.

Example 24 provides a n electronic device, including a carrier substrate; and one or more of the IC devices according to any one of examples 1-20 and the IC package according to any one of examples 21-23, coupled to the carrier substrate.

Example 25 provides the electronic device according to example 24, where the carrier substrate is a motherboard.

Example 26 provides the electronic device according to example 24, where the carrier substrate is a PCB.

Example 27 provides the electronic device according to any one of examples 24-26, where the electronic device is a wearable electronic device or handheld electronic device.

Example 28 provides the electronic device according to any one of examples 24-27, where the electronic device further includes one or more communication chips and an antenna.

Example 29 provides the electronic device according to any one of examples 24-28, where the electronic device is an RF transceiver.

Example 30 provides the electronic device according to any one of examples 24-28, where the electronic device is one of a switch, a power amplifier, a low-noise amplifier, a filter, a filter bank, a duplexer, an upconverter, or a downconverter of an RF communications device, e.g., of an RF transceiver.

Example 31 provides the electronic device according to any one of examples 24-30, where the electronic device is a computing device.

Example 32 provides the electronic device according to any one of examples 24-31, where the electronic device is included in a base station of a wireless communication system.

Example 33 provides the electronic device according to any one of examples 24-31, where the electronic device is included in a user equipment device of a wireless communication system.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) device, comprising:
a support structure having a first surface and a second surface opposing the first surface;
a first layer comprising at least a portion of a transistor and adjoining the first surface;
a first buried power rail and a second buried power rail that are at least partially buried in the support structure and coupled to the transistor; and
a second layer comprising a capacitor and adjoining the second surface, the capacitor including:
a first capacitor electrode comprising a group of first conductive fingers,
a second capacitor electrode comprising a group of second conductive fingers, and
a capacitor insulator between the first capacitor electrode and the second capacitor electrode,
wherein individual first conductive fingers alternate with individual second conductive fingers, the capacitor insulator is between an individual first conductive finger and an individual second conductive finger, the first capacitor electrode is coupled to the first buried power rail, and the second capacitor electrode is coupled to the second buried power rail.

2. The IC device according to claim 1, wherein a capacitance of the capacitor per unit area of the IC device is at least 10 femto farad per square micrometer, or a capacitance of the capacitor per unit length of the first or second buried power rail is at least 1 femto farad per micrometer.

3. The IC device according to claim 1, wherein the first capacitor electrode is coupled to the first buried power rail by a via, and a least a portion of the via is inside the support structure.

4. The IC device according to claim 3, wherein the second capacitor electrode is coupled to the second buried power rail by an additional via, and at least a portion of the additional via is inside the support structure.

5. The IC device according to claim 4, wherein the support structure further includes an insulator material between the portion of the via and the portion of the additional via.

6. The IC device according to claim 1, wherein:
the support structure includes an additional capacitor comprising a first additional capacitor electrode, a second additional capacitor electrode, and an additional capacitor insulator,
the first buried power rail comprises:
a first barrier including a first electrical insulator, and
a first core including a first electrical conductor and at least partially enclosed by the first barrier,
the second buried power rail comprises:
a second barrier including a second electrical insulator, and
a second core including a second electrical conductor and at least partially enclosed by the second barrier,
the first additional capacitor electrode includes the first core, and
the second additional capacitor electrode includes the second core.

7. The IC device according to claim 6, wherein the additional capacitor insulator comprises a portion of the first barrier and a portion of the second barrier.

8. The IC device according to claim 7, wherein the additional capacitor insulator further comprises an electrical insulator between the first buried power rail and the second buried power rail.

9. The IC device according to claim 1, further comprising a power plane and a ground plane, the first buried power rail is coupled to the power plane, and the second buried power rail is coupled to the ground plane.

10. An integrated circuit (IC) device, comprising:
a support structure comprising a semiconductor material;
a transistor over or at least partially in the support structure;
a first buried power rail in the support structure, the first buried power rail coupled to the transistor;
a second buried power rail in the support structure, the second buried power rail coupled to the transistor; and
an electrical insulator between the first buried power rail and the second buried power rail, wherein the electrical insulator includes a first surface and a second surface, the first surface opposes the second surface, and a distance between the first surface and the second surface is in a range from 1 nanometer to 3 nanometers,
wherein the first buried power rail has a hollow structure, and at least part of the electrical insulator and the second buried power rail are inside the hollow structure.

11. The IC device according to claim 10, wherein the first buried power rail or the second buried power rail comprises:
a core including an electrical conductor, and
a barrier including an additional electrical insulator.

12. The IC device according to claim 10, wherein the first surface adjoins the first buried power rail, and the second surface adjoins the second buried power rail.

13. The IC device according to claim 10, wherein the electrical insulator has an additional hollow structure, and at least part of the second buried power rail is inside the additional hollow structure.

14. The IC device according to claim 10, further comprising a capacitor outside the support structure, the capacitor comprising:
a first capacitor electrode coupled to the first buried power rail;
a second capacitor electrode coupled to the second buried power rail; and
a capacitor insulator between the first capacitor electrode and the second capacitor electrode.

15. The IC device according to claim 10, wherein the first buried power rail, the second buried power rail, and the electrical insulator constitute a capacitor, and a capacitance of the capacitor per unit length of the first or second buried power rail is equal to or greater than 1 femto farad per micrometer.

16. An integrated circuit (IC) device, comprising:
a support structure having a first surface and a second surface opposing the first surface;
a first elongated structure comprising a first electrically conductive material and having a longitudinal axis substantially parallel to the first surface or the second surface;
a second elongated structure comprising a second electrically conductive material and having a longitudinal axis substantially parallel to the first surface or the second surface;
a transistor over or at least partially in the support structure, the transistor coupled to the first elongated structure and the second elongated structure, wherein the transistor is closer to the first surface than the second surface;
a first electrical conductor that is closer to the second surface than the first surface, the first electrical conductor coupled to the first elongated structure;
a second electrical conductor that is closer to the second surface than the first surface, the second electrical conductor coupled to the second elongated structure; and
an electrical insulator between the first electrical conductor and the second electrical conductor,
wherein the first electrical conductor, the second electrical conductor, and an electrical insulator are in a capacitor, and a capacitance of the capacitor per unit area of the IC device is at least 10 femto farad per square micrometer or a capacitance of the capacitor per unit length of the first elongated structure or the second elongated structure is at least 1 femto farad per micrometer.

17. The IC device according to claim 16, wherein the first electrical conductor is coupled to the first elongated structure by a first via, at least a portion of the first via is inside the support structure, the second electrical conductor is coupled to the second elongated structure by a second via, and at least a portion of the second via is inside the support structure.

18. The IC device according to claim 16, wherein the support structure further comprises an electrical insulator between the first elongated structure and the second elongated structure.

* * * * *